(12) United States Patent
Murukesan et al.

(10) Patent No.: US 10,679,987 B2
(45) Date of Patent: Jun. 9, 2020

(54) BOOTSTRAP METAL-OXIDE-SEMICONDUCTOR (MOS) DEVICE INTEGRATED WITH A HIGH VOLTAGE MOS (HVMOS) DEVICE AND A HIGH VOLTAGE JUNCTION TERMINATION (HVJT) DEVICE

(71) Applicant: Taiwan Semiconductor Manufacturing Co., Ltd., Hsin-Chu (TW)

(72) Inventors: Karthick Murukesan, Hsinchu (TW); Wen-Chih Chiang, Hsinchu (TW); Chiu-Hua Chung, Hsinchu (TW); Chun Lin Tsai, Hsin-Chu (TW); Kuo-Ming Wu, Hsinchu (TW); Shiuan-Jeng Lin, Hsinchu (TW); Tien Sheng Lin, Yangmei Township (TW); Yi-Min Chen, Hsinchu (TW); Hung-Chou Lin, Douliu (TW); Yi-Cheng Chiu, New Taipei (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 16/128,578

(22) Filed: Sep. 12, 2018

(65) Prior Publication Data
US 2019/0131296 A1   May 2, 2019

Related U.S. Application Data

(60) Provisional application No. 62/579,480, filed on Oct. 31, 2017.

(51) Int. Cl.
*H01L 29/06* (2006.01)
*H01L 27/07* (2006.01)
(Continued)

(52) U.S. Cl.
CPC ........ *H01L 27/0727* (2013.01); *H01L 21/761* (2013.01); *H01L 21/823418* (2013.01);
(Continued)

(58) Field of Classification Search
CPC ............. H01L 27/0727; H01L 27/0629; H01L 29/7823; H01L 21/761; H01L 21/823493;
(Continued)

(56) References Cited

U.S. PATENT DOCUMENTS 6,124,628 A   9/2000 Fujihira et al.
8,143,699 B2  3/2012 Ching et al.
(Continued)

OTHER PUBLICATIONS

Triebl, O. "Reliability Issues in High-Voltage Semiconductor Devices." 2.2 Device Design Techniques. The publication date is unknown. Retrieved online on Jan. 8, 2018 from http://www.iue.tuwien.ac.at/phd/triebl/node9.html.
(Continued)

*Primary Examiner* — David Vu
(74) *Attorney, Agent, or Firm* — Eschweiler & Potashnik, LLC

(57) ABSTRACT

Various embodiments of the present application are directed towards an integrated circuit (IC) in which a bootstrap metal-oxide-semiconductor (MOS) device is integrated with a high voltage metal-oxide-semiconductor (HVMOS) device and a high voltage junction termination (HVJT) device. In some embodiments, a drift well is in the semiconductor substrate. The drift well has a first doping type and has a ring-shaped top layout. A first switching device is on the drift well. A second switching device is on the semiconductor substrate, at an indent in a sidewall the drift well. A peripheral well is in the semiconductor substrate and has a second doping type opposite the first doping type. The peripheral well surrounds the drift well, the first switching device, and the second switching device, and further sepa-
(Continued)

rates the second switching device from the drift well and the first switching device.

20 Claims, 15 Drawing Sheets

(51) Int. Cl.
*H01L 21/8234* (2006.01)
*H01L 21/761* (2006.01)
*H01L 29/78* (2006.01)
*H01L 27/06* (2006.01)
*H01L 29/861* (2006.01)

(52) U.S. Cl.
CPC .. *H01L 21/823493* (2013.01); *H01L 27/0629* (2013.01); *H01L 29/7823* (2013.01); *H01L 29/861* (2013.01)

(58) Field of Classification Search
CPC ........... H01L 21/823418; H01L 29/861; H01L 29/0634; H01L 29/66681; H01L 29/0696; H01L 29/402; H01L 29/42368
See application file for complete search history.

(56) References Cited

U.S. PATENT DOCUMENTS

| | | |
|---|---|---|
| 8,587,073 B2 | 11/2013 | Cheng |
| 8,629,513 B2 | 1/2014 | Su et al. |
| 8,680,616 B2 | 3/2014 | Su et al. |
| 9,190,535 B2 | 11/2015 | Yeh et al. |
| 9,680,009 B2 | 6/2017 | Murukesan et al. |
| 2006/0220168 A1 | 10/2006 | Hsing |
| 2008/0074165 A1 | 3/2008 | Jeon et al. |
| 2010/0109081 A1 | 5/2010 | Chen et al. |
| 2010/0283116 A1 | 11/2010 | Shimizu |
| 2012/0139041 A1 | 6/2012 | Su et al. |
| 2013/0341718 A1 | 12/2013 | Kim et al. |
| 2015/0014783 A1 | 1/2015 | Imai et al. |
| 2017/0271506 A1 | 9/2017 | Yamaji |
| 2018/0033854 A1 | 2/2018 | Kaya et al. |
| 2018/0069076 A1 | 3/2018 | Tanaka et al. |
| 2019/0096988 A1 | 3/2019 | Murukesan et al. |

OTHER PUBLICATIONS

Notice of Allowance dated Aug. 20, 2019 in connection with U.S. Appl. No. 15/964,636.
International Rectifier. "HV Floating MOS-Gate Driver ICs." Mar. 23, 2007.
Hwang, Jong-Tae. "How to Drive Switching Devices Without Losing Speed." EE Times, May 26, 2005.
Allen, P.E. "Lecture 140—The MOS Switch and Diode." Mar. 25, 2010.

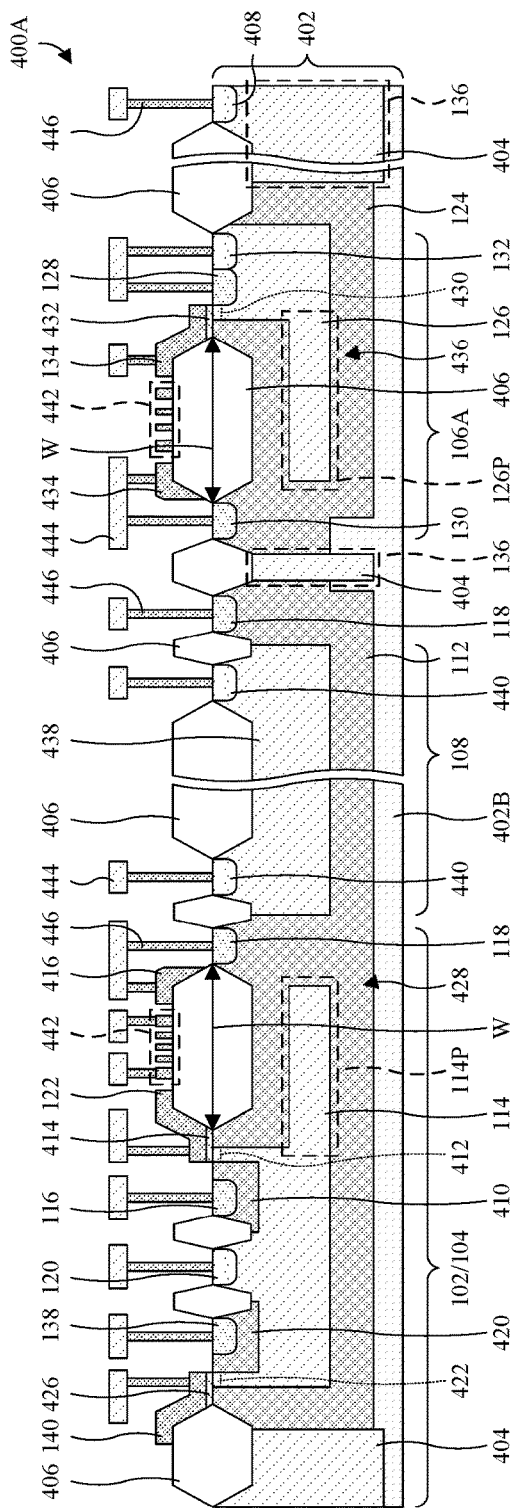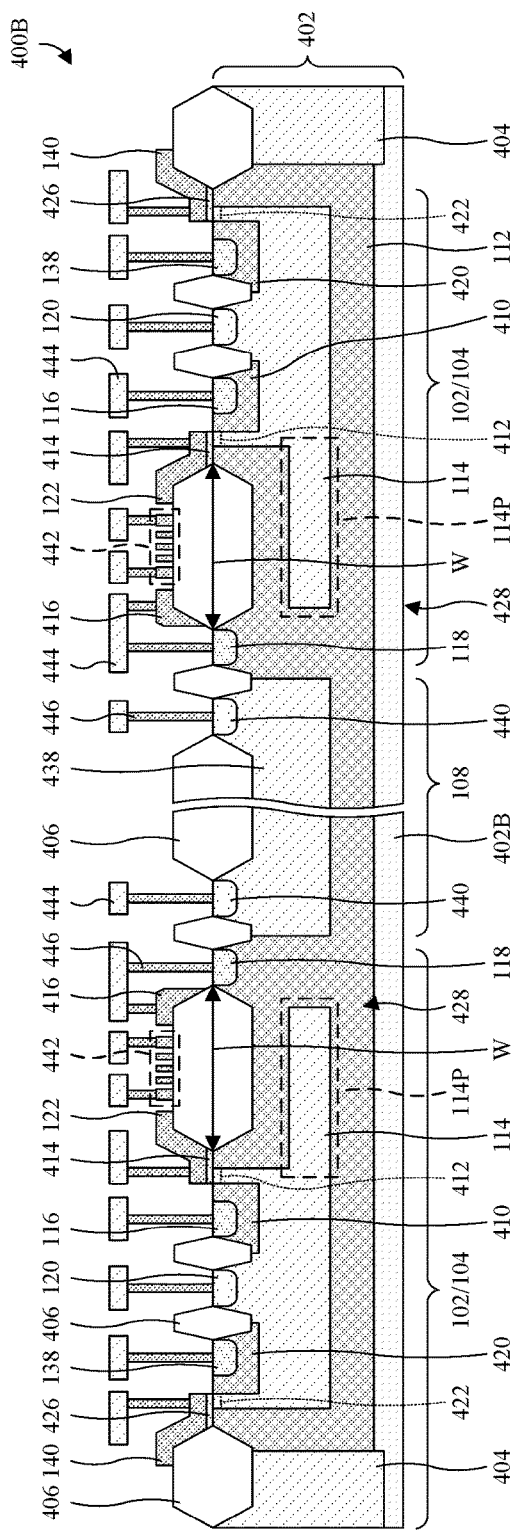
Fig. 4A
Fig. 4B

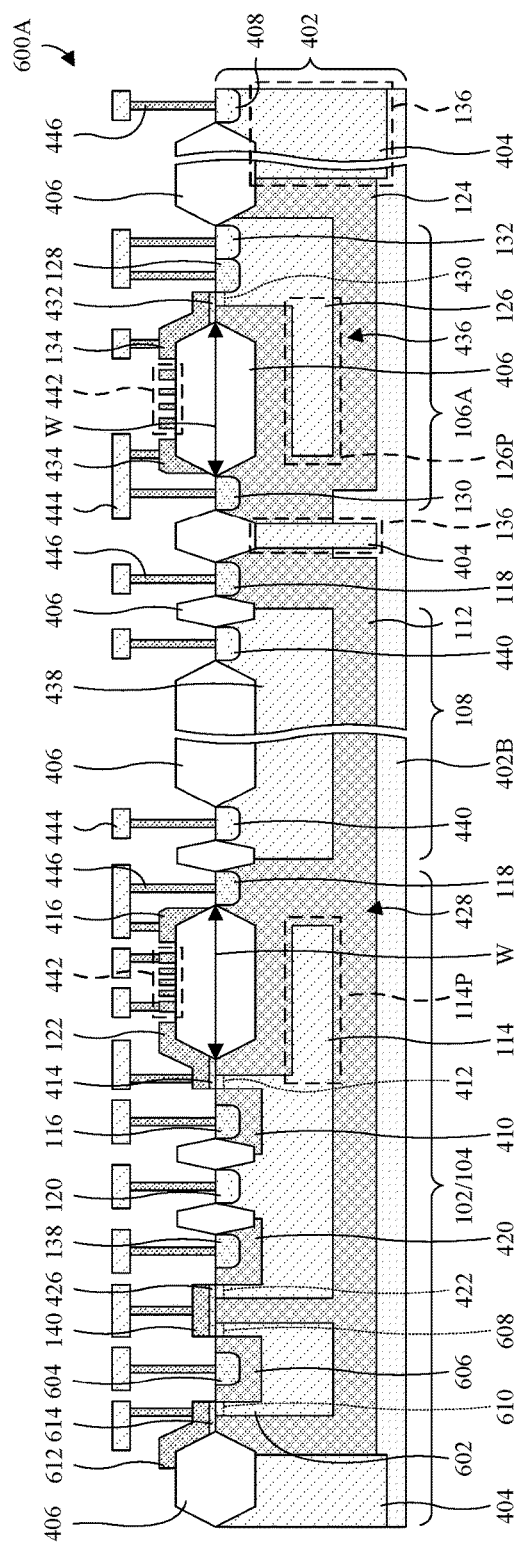
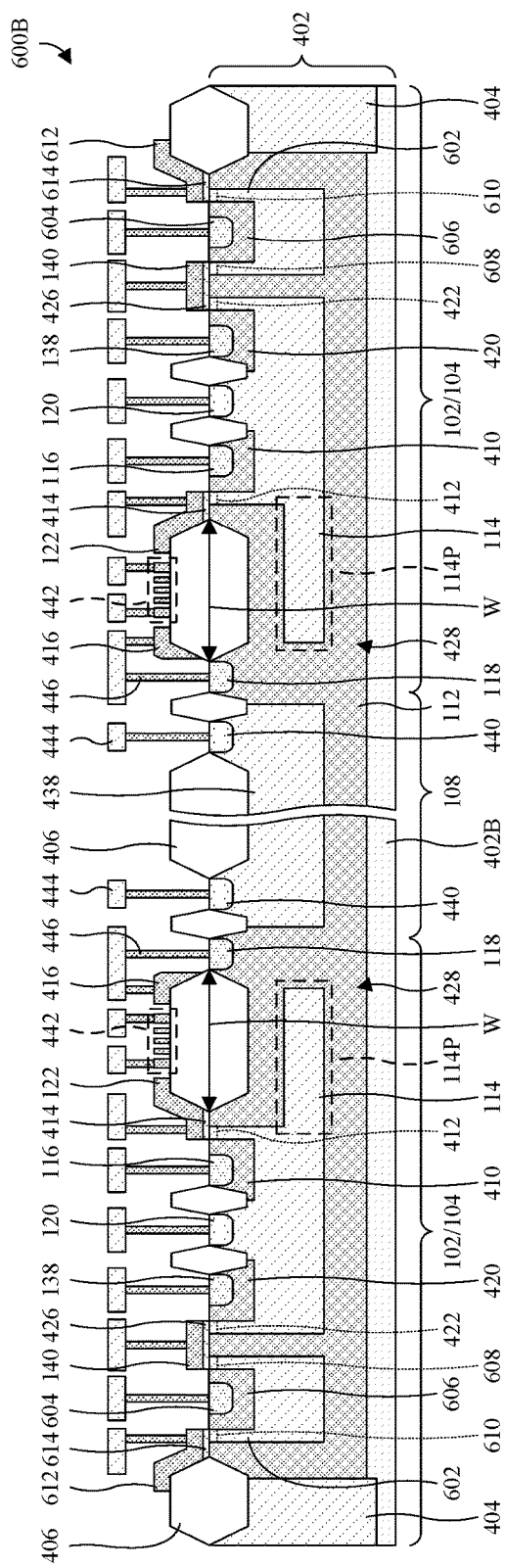
Fig. 6A
Fig. 6B

US 10,679,987 B2

BOOTSTRAP METAL-OXIDE-SEMICONDUCTOR (MOS) DEVICE INTEGRATED WITH A HIGH VOLTAGE MOS (HVMOS) DEVICE AND A HIGH VOLTAGE JUNCTION TERMINATION (HVJT) DEVICE

REFERENCE TO RELATED APPLICATIONS

This Application claims the benefit of U.S. Provisional Application No. 62/579,480, filed on Oct. 31, 2017. The contents of the above-referenced application are hereby incorporated by reference in their entirety.

BACKGROUND

Ultrahigh voltage metal-oxide-semiconductor (MOS) devices are semiconductor devices that can sustain operation at voltages of several hundred volts, such as, for example, voltages around 600 volts. Among other things, ultrahigh voltage MOS devices are used for level shifters in high-side gate driver circuits. Such a level shifter translates an input signal at a first voltage level to an output signal at a second voltage level to resolve incompatibility between devices that respectively operate at the first and second voltage levels.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A and 4B illustrate various cross-sectional views of some more detailed embodiments of the IC of FIG. 1B.

FIGS. 6A and 6B illustrate various cross-sectional views of some other embodiments of the IC of FIGS. 4A and 4B in which the bootstrap MOS device has an additional bootstrap gate electrode.

DETAILED DESCRIPTION

Figure 1A:
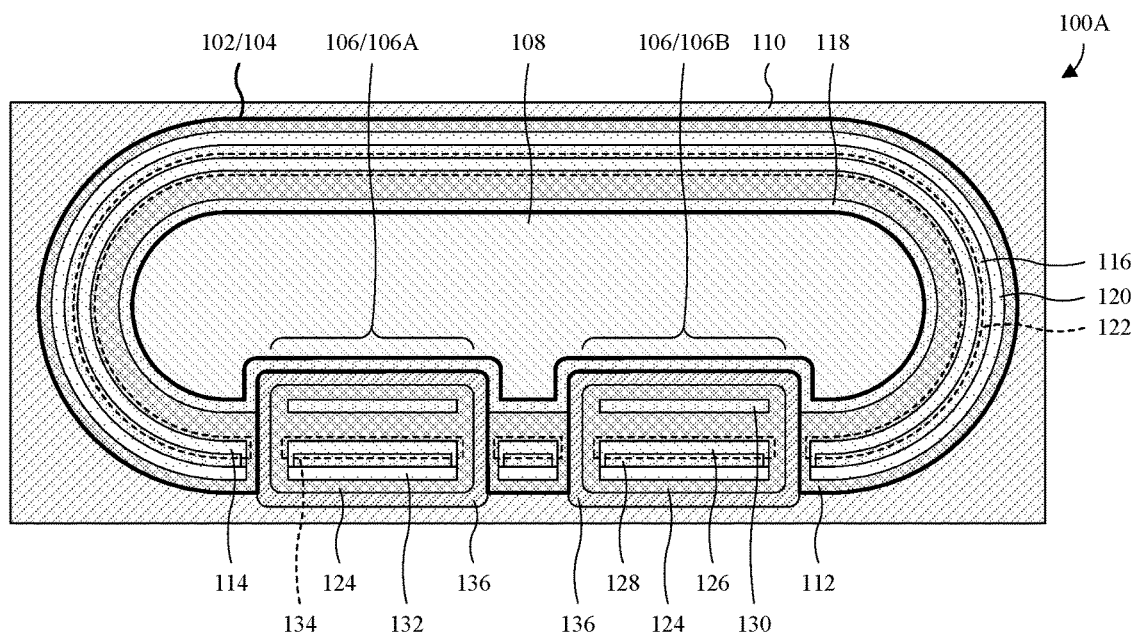
FIG. 1A illustrates a top layout of some embodiments of an integrated circuit (IC) in which a bootstrap metal-oxide-semiconductor (MOS) device is integrated with a high voltage MOS (HVMOS) device and a high voltage junction termination (HVJT) device.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated circuit (IC) may, for example, comprise a high side area and a low voltage area. The high side area includes devices that operate at a high voltage level, and the low voltage area includes devices that operate at a comparatively low voltage level. A high voltage junction termination (HVJT) device has a ring-shaped top layout that surrounds and demarcates the high side area. Further, the HVJT device separates the high side area from the low voltage area and a high voltage metal-oxide-semiconductor (HVMOS) device. The HVMOS device partially or wholly defines a level shifter translating an input signal at the low voltage level to an output signal at the high voltage level. Further, the HVMOS device is electrically coupled to a device in the high side area to provide the output signal to the device. Such electrical coupling may, for example, be performed externally by wire bonding, or internally by metal wires of a back-end-of-line (BEOL) interconnect structure.

A challenge with using wire bonding to externally electrically couple the HVMOS device to the device in the high side area is that wire bonding has high process costs and low reliability in extreme environments (e.g., environments with high pressure and/or high temperature). A challenge with using metal wires of a BEOL interconnect structure to internally electrically couple the HVMOS to the device in the high side area is that the metal wires depend upon an opening in the HVJT device. This leads to reliability issues (e.g., a low breakdown voltage), limits the number of HVMOS devices, and increases complexity.

A gate driver circuit may, for example, comprise the IC die, a bootstrap capacitor, and a bootstrap diode. The bootstrap capacitor serves as a power supply for the high side area, and aids in turning a high-side gate driver in the high side area to an ON state. While the high-side gate driver is in an ON state, the bootstrap diode is in a reverse biased state so as to electrically isolate a low voltage power supply of the low voltage area from the bootstrap capacitor. While the high-side gate driver is in an OFF state, the bootstrap diode is in a forward biased state so as to electrically couple the low voltage power supply to the bootstrap capacitor and to charge the bootstrap capacitor from the low voltage power supply.

A challenge with the gate driver circuit is that the bootstrap diode is separate from the IC die. For example, the bootstrap diode and the IC die may be mounted to a printed circuit board (PCB) and may be electrically coupled via the PCB. However, this takes up space on the PCB and lacks the design flexibility of wafer level integration. As another example, the bootstrap diode and the IC die may be packaged together and electrically coupled within a common package by wire bonding. However, this also lacks the design flexibility of wafer level integration. Another challenge with the gate driver circuit is that the bootstrap diode is a "diode" and has a switching time between a blocking state and a non-blocking state. This, in turn, limits the speed at which the bootstrap capacitor can be charged and the speed at which the high-side gate driver can be changed between the ON state and the OFF state.

In view of the foregoing, various embodiments of the present application are directed towards an IC in which a bootstrap MOS device is integrated with a HVMOS device and an HVJT device. In some embodiments, a drift well is in the semiconductor substrate. The drift well has a first doping type and has a ring-shaped top layout surrounding a high side area. A first switching device is on the drift well. A second switching device is on the semiconductor substrate, at an indent in a sidewall the drift well. A peripheral well is in the semiconductor substrate and has a second doping type opposite the first doping type. The peripheral well surrounds the drift well, the first switching device, and the second switching device, and further separates the second switching device from the first switching device and the drift well.

The first and second switching devices may, for example, correspond to the bootstrap MOS device and the HVMOS device. Further, the HVJT device is or comprises a diode, which may, for example, be defined by a PN junction at which the drift well and the peripheral well contact. When the three devices are used in a gate driver circuit (a non-limiting example of which is described above), the bootstrap MOS device may, for example, be used in place of a bootstrap diode to charge a bootstrap capacitor. In comparison to the bootstrap diode, the bootstrap MOS device is fast to switch between a blocking state and a non-blocking state, whereby the bootstrap MOS device enables fast charging of the bootstrap capacitor.

By integrating the bootstrap MOS device with the HVJT device and the HVMOS device, IC chip area is low and reliability is high. For example, because of the integration, the three devices share a common IC chip area instead of separate IC chip areas. This leads to a reduction in overall IC chip area (e.g., about a 25-60% reduction). As another example, because of the integration, the three devices may be electrically coupled without wire bonding and without an opening in the HVJT device. This leads to enhanced reliability. Further, as seen hereafter, the integration scheme provides design flexibility and does not depend upon additional photomasks or photoreticles. For example, the integration scheme enables the number of HVMOS devices to be increased and/or the size of the high side area to be increased without complex redesigns and without increased IC chip area by the HVJT, bootstrap MOS, and HVMOS devices. Further, the integration scheme enables a voltage handling capability and/or a current handling capability of the HVMOS device, the bootstrap MOS device, and the HVJT device to be varied without complex redesigns.

With reference to FIG. 1A, a top layout 100A of some embodiments of an IC in which a bootstrap MOS device 102 is integrated with a HVJT device 104 and HVMOS devices 106. The bootstrap MOS device 102 and the HVJT device 104 overlap and border the HVMOS devices 106. Further, the bootstrap MOS device 102, the HVJT device 104, and the HVMOS devices 106 collectively define a ring-shaped structure extending laterally in a closed path along a boundary of a high side area 108 of the IC to surround the high side area 108. In some embodiments, the ring-shaped structure is square ring shaped, rectangular ring shaped, triangular ring shaped, circular ring shaped, or some other closed path shape. Further, the ring-shaped structure is surrounded by a low voltage area 110 of the IC.

The high side area 108 accommodates semiconductor devices (not shown) operating at a high voltage level, and the low voltage area 110 accommodates semiconductor devices (not shown) operating at a low voltage level. The high voltage level is high relative to the low voltage level and may be or comprise, for example, voltages between about 100-1200 volts, voltages between about 100-750 volts, voltages between about 750-1200 volts, voltages between about 550-650 volts, or voltages in excess of about 100 volts. The low voltage level may be or comprise, for example, voltages between about 1-20 volts, voltages between about 1-10 volts, voltages between about 10-20 volts, or voltages less than about 20 volts.

The bootstrap MOS device 102 is a transistor or some other switching device capable of sustained operation at the high voltage level. For example, the bootstrap MOS device 102 may be a laterally diffused metal-oxide-semiconductor (LDMOS) device or some other metal-oxide-semiconductor (MOS) device, and/or may sustain operation while source-drain voltages are at the high voltage level. The bootstrap MOS device 102 facilitates high speed charging of a bootstrap capacitor (not shown) in a gate driver circuit since the bootstrap MOS device 102 can more quickly change between a blocking state and a non-blocking state than a diode. Further, as seen hereafter, the bootstrap MOS device 102 may be enhanced with additional selectively-conductive channels to carry more current, thereby charging the bootstrap capacitor faster.

The bootstrap MOS device 102 is on a shared drift well 112 and a bootstrap body well 114. As seen hereafter, the shared drift well 112 is shared between the bootstrap MOS device 102 and the HVJT device 104. The bootstrap MOS device 102 comprises a first bootstrap source/drain region 116, a second bootstrap source/drain region 118, a bootstrap body contact region 120, and a bootstrap gate electrode 122. The shared drift well 112 is a semiconductor region with a first doping type and surrounds the bootstrap body well 114. The bootstrap body well 114 is a semiconductor region with a second doping type opposite the first doping type and underlies the first bootstrap source/drain region 116 and the bootstrap body contact region 120 when viewed in cross-section (not visible within FIG. 1A). The first doping type may, for example, be n-type, and the second doping type may, for example, be p-type, or vice versa.

The first and second bootstrap source/drain regions 116, 118 are spaced by the shared drift well 112 and the bootstrap body well 114, such that the first and second bootstrap source/drain region 116, 118 respectively border the low voltage area 110 and the high side area 108. The first and second bootstrap source/drain regions 116, 118 are semiconductor regions with the same doping type as the shared drift well 112 (i.e., the first doping type), but higher doping concentrations than the shared drift well 112. The bootstrap body contact region 120 is a semiconductor region with the same doping type as the bootstrap body well 114 (i.e., the second doping type), but a higher doping concentration than the bootstrap body well 114. The bootstrap gate electrode 122 (shown in phantom) overlies the bootstrap body well 114 when viewed in cross-section (not visible within FIG. 1A), such that the bootstrap gate electrode 122 borders the first bootstrap source/drain region 116 and is mostly between the first and second bootstrap source/drain regions 116, 118. The bootstrap gate electrode 122 may be or comprise, for example, doped polysilicon, metal, or some other conductive material.

The HVJT device 104 is or comprises a diode capable of sustained operation at the high voltage level and is configured to operate in a reverse biased state to provide electrical isolation between the high side area 108 and the low voltage area 110. Further, the HVJT device 104 overlaps with the bootstrap MOS device 102 in that a PN junction of the diode is defined in part by the shared drift well 112, and the HVJT device 104 and the bootstrap MOS device 102 share the shared drift well 112.

The HVMOS devices 106 are transistors or some other switching devices capable of sustained operation at the high voltage level. For example, the HVMOS devices 106 may be LDMOS devices or some other MOS devices, and/or may sustain operation while source-drain voltages are at the high voltage level. In some embodiments, the HVMOS devices 106 partially or wholly define a level shifter translating an input signal at the low voltage level to an output signal at the high voltage level. The HVMOS devices 106 comprise a first HVMOS device 106A and a second HVMOS device 106B.

Each of the HVMOS devices 106 is on a HVMOS drift well 124 and a HVMOS body well 126. Further, each of the HVMOS devices 106 comprises a first HVMOS source/drain region 128, a second HVMOS source/drain region 130, an HVMOS body contact region 132, and an HVMOS gate electrode 134. The HVMOS drift well 124 is a semiconductor region with a first doping type and surrounds the HVMOS body well 126. The HVMOS body well 126 is a semiconductor region with a second doping type opposite the first doping type. Further, the HVMOS body well 126 underlies the first HVMOS source/drain region 128 and the HVMOS body contact region 132 when viewed in cross-section (not visible within FIG. 1A).

The first and second HVMOS source/drain regions 128, 130 are spaced by the HVMOS drift well 124 and the HVMOS body well 126, such that the first HVMOS source/drain region 128 borders the low voltage area 110 and the second HVMOS source/drain region 130 borders the high side area 108. The first and second HVMOS source/drain regions 128, 130 are semiconductor regions with the first doping type, but higher doping concentrations than the HVMOS drift well 124. The HVMOS body contact region 132 is a semiconductor region with the second doping type, but a higher doping concentration than the HVMOS body well 126. The HVMOS gate electrode 134 overlies the HVMOS body well 126 when viewed in cross-section (not visible within FIG. 1A), such that the HVMOS gate electrode 134 borders the first HVMOS source/drain region 128 and is mostly between the first and second HVMOS source/drain regions 128, 130. The HVMOS gate electrode 134 may be or comprise, for example, doped polysilicon, metal, or some other conductive material.

The HVMOS devices 106 are individually surrounded by isolation rings 136 physically and electrically separating the HVMOS devices 106 from the high side area 108, the HVJT device 104, and the bootstrap MOS device 102. For example, the isolation rings 136 may define diodes with the shared drift well 112 and/or the HVMOS drift wells 124, and the diodes may operate in the blocking state to provide electrical separation. While the isolation rings 136 may be circular ring shaped, the isolation rings 136 are not limited to circular ring shaped. The isolation rings 136 may be square ring shaped, rectangular ring shaped, triangular ring shaped, or some other closed path shape. In some embodiments, the isolation rings 136 are semiconductor regions with an opposite doping type as the shared and HVMOS drift wells 112, 124. The isolation rings 136 facilitate efficient integration of the bootstrap MOS device 102, the HVJT device 104, and the HVMOS devices 106 without increased IC chip area.

The integration leads to low IC chip area and high reliability. For example, because the bootstrap, HVJT, and HVMOS devices 102, 104, 106 are integrated, the bootstrap, HVJT, and HVMOS devices 102, 104, 106 share a common IC chip area instead of separate IC chip areas. This leads to a reduction in overall IC chip area. As another example, because the bootstrap, HVJT, and HVMOS devices 102, 104, 106 are integrated, the bootstrap, HVJT, and HVMOS devices 102, 104, 106 may be electrically coupled without wire bonding and without an opening in the HVJT device 104. This leads to enhanced reliability.

As seen hereafter, the integration scheme allows the number of HVMOS devices to be increased and/or the size of the high side area 108 to be increased without complex redesigns, and without the bootstrap, HVJT, and HVMOS devices 102, 104, 106 using more IC chip area. Further, the integration scheme allows voltage handling capabilities and/or current handling capabilities of the bootstrap, HVJT, and HVMOS devices 102, 104, 106 to be varied without complex redesigns. For example, the integration scheme enables a thickness of the ring-shaped structure defined by the bootstrap, HVJT, and HVMOS devices 102, 104, 106 to be increased without complex redesigns. This, in turn, enables the bootstrap, HVJT, and HVMOS devices 102, 104, 106 to sustain operation at higher voltages. As another example, the integration scheme enables a width of the HVMOS devices 106 to be increased without complex redesigns widening the isolation rings 136. This, in turn, enables the HVMOS devices 106 to sustain operation at higher source-drain currents.

While the IC is illustrated as having two HVMOS devices (i.e., the first HVMOS device 106A and the second HVMOS device 106B) in FIG. 1A, the first or the second HVMOS device 106A, 106B may be omitted in other embodiments. Further, as seen hereafter, the IC may have one or more additional HVMOS devices in other embodiments. In such embodiments, the one or more additional HVMOS devices are each as described above and are each positioned along the boundary of the high side area 108. Further yet, while the bootstrap MOS device 102 and the HVMOS devices 106 are described as "metal-oxide-semiconductor (MOS)" devices, it is to be understood that the bootstrap MOS device 102 and the HVMOS devices 104 are not limited to "metal" and "oxide". Other conductive materials (e.g., doped polysilicon) may be used in place of metal, and other dielectric materials may be used in place of oxide.

Figure 1B:
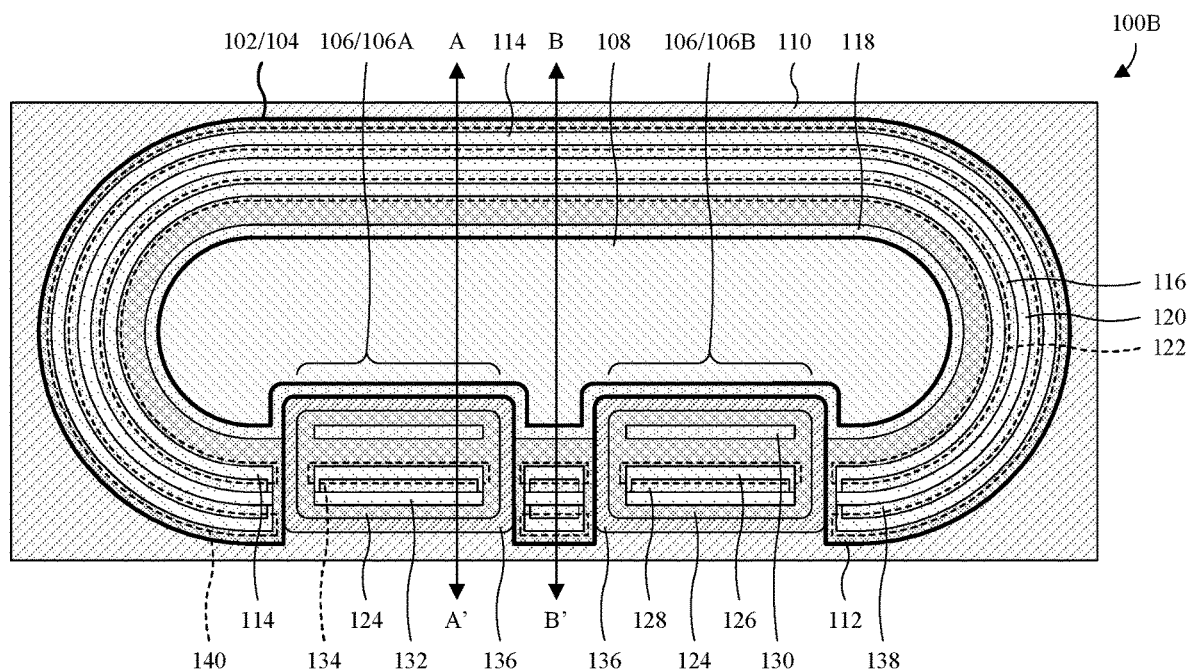
FIG. 1B illustrates a top layout of some other embodiments of the IC of FIG. 1A in which the bootstrap MOS device has an additional bootstrap gate electrode.

With reference to FIG. 1B, a top layout 100B of some other embodiments of the IC of FIG. 1A is provided in which the bootstrap MOS device 102 further comprises (in addition to the features of FIG. 1A) a third bootstrap source/drain region 138 and a second bootstrap gate electrode 140.

The third bootstrap source/drain region 138 borders the bootstrap body contact region 120, such that the bootstrap body contact region 120 is sandwiched between the third bootstrap source/drain region 138 and the first bootstrap source/drain region 116. The third bootstrap source/drain region 138 is a semiconductor region with the same doping type as the shared drift well 112, but a higher doping concentration than the shared drift well 112. The second bootstrap gate electrode 140 (shown in phantom) borders the third bootstrap source/drain region 138, such that the third bootstrap source/drain region 138 is sandwiched between the second bootstrap gate electrode 140 and the bootstrap body contact region 120. Further, the second bootstrap gate electrode 140 overlies the bootstrap body well 114 when viewed in cross-section (not visible within FIG. 1B). The second bootstrap gate electrode 140 may be or comprise, for example, doped polysilicon, metal, or some other conductive material.

During use of the bootstrap MOS device 102, a selectively-conductive channel (not shown) in the bootstrap body well 114 selectively conducts depending upon whether a bias voltage applied to the second bootstrap gate electrode 140 exceeds a threshold voltage. When the selectively-conductive channel is non-conducting, the third bootstrap source/drain region 138 is electrically separated from the second bootstrap source/drain region 118 by the bootstrap body well 114. When the selectively-conductive channel is conducting, the third bootstrap source/drain region 138 is electrically coupled to the second bootstrap source/drain region 118 through the bootstrap drift well 112.

Figure 2:
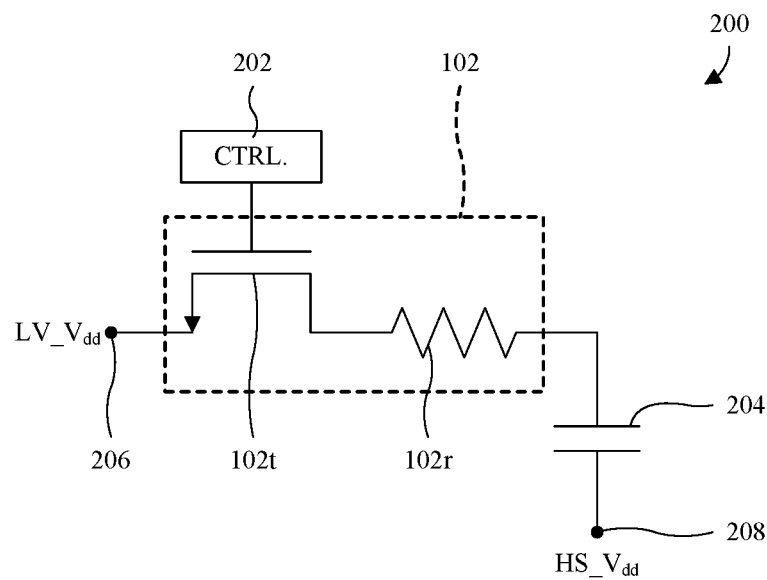
FIG. 2 illustrates a block diagram of some embodiments of a bootstrap circuit in which the bootstrap MOS devices of FIGS. 1A and 1B find application.

With reference to FIG. 2, a block diagram 200 of some embodiments of a bootstrap circuit in which the bootstrap MOS device 102 of FIG. 1A or 1B finds application is provided. As seen hereafter (see, e.g., FIG. 11), the bootstrap circuit may, for example, be part of a high-side gate driver circuit. However, a remainder of the high-side gate driver circuit is omitted for the time being to more simply explain the role of the bootstrap MOS device 102.

The bootstrap MOS device 102 is controlled by a controller 202 and is connected in series with a bootstrap capacitor 204 from a low voltage supply node 206 (e.g., $LV\_V_{dd}$) to a high side supply node 208 (e.g., $HS\_V_{dd}$). The bootstrap MOS device 102 may, for example, be modeled as a transistor 102t in series with a resistor 102r, where the resistor 102r represents the ON resistance of the transistor 102t. The controller 202 may be or comprise, for example, a microcontroller, an application-specific integrated circuit (ASIC), or some other control circuit or device. The bootstrap capacitor 204 stores energy to power semiconductor devices (not shown) in the high side area 108 of FIG. 1A or 1B.

The low voltage supply node 206 and the high side supply node 208 carry direct current (DC) voltages. The low voltage supply node 206 is at a fixed voltage that may, for example, be at about 1-20 volts, about 1-10 volts, or about 10-20 volts. The high side supply node 208 varies between a low voltage less than that of the low voltage supply node 206, floating, and a high voltage greater than that of the low voltage supply node 206. The low voltage may, for example, be at about zero volts or ground, 1-9 volts, 10-19 volts, or some other voltage less than that of the low voltage supply node 206. The high voltage may, for example, be about 300-1200 volts, about 300-750 volts, about 750-1200 volts, or some other voltage greater than that of the low voltage supply node 206. The voltage across the bootstrap capacitor 204 ranges from about 0 volts to about the voltage at the low voltage supply node 206 depending upon how much energy is stored by the bootstrap capacitor 204.

During use of the bootstrap circuit, the controller 202 switches the bootstrap MOS device 102 between the blocking and non-blocking states to charge the bootstrap capacitor 204. While charging the bootstrap capacitor 204, the bootstrap MOS device 102 is in the non-blocking state and the high side supply node 208 is at the low voltage (e.g., ground). Once the bootstrap capacitor 204 is charged, the bootstrap MOS device 102 is in the blocking state and the high side supply node 208 is floating or at the high voltage (e.g., about 600 volts). In some embodiments, the controller 202 may control the gate-to-source voltage of the bootstrap MOS device 102 to vary the voltage across the bootstrap capacitor 204. For example, increasing the gate-to-source voltage decreases the ON resistance of the bootstrap MOS device 102 (represented by the resistor 102r), which increases the voltage across the bootstrap capacitor 204.

In embodiments in which a source region of the bootstrap MOS device 102 is electrically coupled to the low voltage supply node 206, the bootstrap MOS device 102 has a source floating capability (SFC) exceeding a voltage at the low voltage supply node 206. For example, where the voltage at the low voltage supply node 206 is about 20 volts, the SFC may be about 21-35 volts, about 35-50 volts, about 50-100 volts, greater than about 20 volts, or greater than about 35 volts. The SFC is the low-side breakdown voltage of the bootstrap MOS device 102 (i.e., the maximum voltage at the source region of the bootstrap MOS device 102). Since the bootstrap MOS device 102 is used to charge the bootstrap capacitor 204 while the high side supply node 208 is at a lower voltage than the low voltage supply node 206, the bootstrap MOS device 102 would be unsuitable for charging the bootstrap capacitor 204 if the SFC did not exceed the voltage at the low voltage supply node 206.

A diode may be used in place of the bootstrap MOS device 102. For example, a cathode of the diode may be electrically coupled to the bootstrap capacitor 204 and an anode of the diode may be electrically coupled to the low voltage supply node 206. However, the diode is slow to switch between a blocking state and a non-blocking state by comparison to the bootstrap MOS device 102, which limits the speed at which the bootstrap capacitor 204 can be charged. Therefore, the bootstrap MOS device 102 leads to faster charging.

Figure 3:
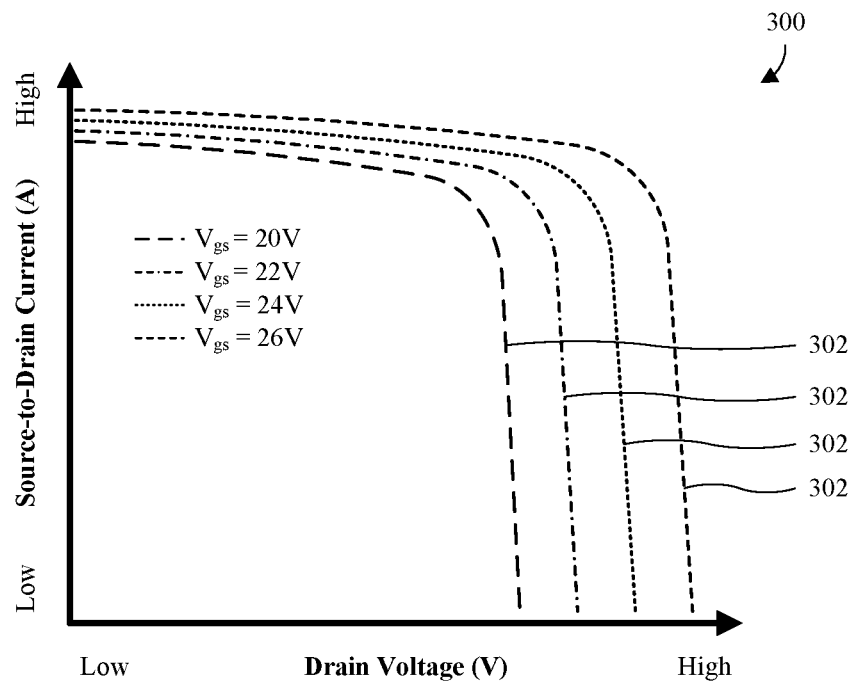
FIG. 3 illustrates a graph of some embodiments of current curves for the bootstrap MOS devices of FIGS. 1A and 1B.

With reference to FIG. 3, a graph 300 illustrates some embodiments of current curves 302 for the bootstrap MOS device 102 of FIG. 2 while charging the bootstrap capacitor 204 of FIG. 2. Each of the current curves 302 corresponds to a different gate-to-source (e.g., $V_{gs}$) and describes the source-to-drain current of the bootstrap MOS device 102 as a function of drain voltage. Since the bootstrap MOS device 102 is electrically coupled in series with the bootstrap capacitor 204, the source-to-drain current of the bootstrap MOS device 102 is the same as the charging current of the bootstrap capacitor 204.

As illustrated by FIG. 3, increasing the gate-to-source voltage increases the drain voltage of the bootstrap MOS device 102. Since the drain of the bootstrap MOS device 102 is electrically coupled to the bootstrap capacitor 204 (see FIG. 2), the drain voltage is the same as or about the same as the charging voltage of the bootstrap capacitor 204.

With reference to FIG. 4A, a cross-sectional view 400A of some more detailed embodiments of the IC of FIG. 1B is provided. The cross-sectional view 400A may, for example, be taken along line A-A' in FIG. 1B. As illustrated, the bootstrap MOS device 102, the HVJT device 104, and the first HVMOS device 106A are on a semiconductor substrate 402. The semiconductor substrate 402 may be, for example, a bulk silicon substrate, a group III-V substrate, a silicon-on-insulator (SOI) substrate, or some other semiconductor substrate.

A peripheral well 404 is in the semiconductor substrate 402 and overlies a bulk semiconductor region 402B of the semiconductor substrate 402. The peripheral well 404 comprises a pair of segments between which the bootstrap MOS device 102, the HVJT device 104, and the first HVMOS device 106A are sandwiched. Further, the peripheral well 404 comprises the isolation ring 136 separating the first HVMOS device 106A from the high side area 108, the HVJT device 104, and the bootstrap MOS device 102. When viewed top down, the isolation ring 136 extends laterally along a boundary of the first HVMOS device 106A to completely enclose the first HVMOS device 106A. Note this is not visible within the cross-sectional-sectional view 400A of FIG. 4A. In some embodiments, the peripheral well 404 has an elevated doping concentration at the isolation ring 136 relative to remainder of the peripheral well 404. Further, in some embodiments, the peripheral well 404 has the same doping type as, but a different doping concentration than, the bulk semiconductor region 402B.

An isolation structure 406 and a peripheral contact region 408 overlie the peripheral well 404. For ease of illustration, only some segments of the isolation structure 406 are labeled 406. The isolation structure 406 comprises a dielectric material (e.g., silicon oxide), and may be or comprise, for example, a shallow trench isolation (STI) structure, a field oxide (FOX) structure, a local oxidation of silicon (LOCOS) structure, or some other isolation structure. The peripheral contact region 408 is in the semiconductor substrate 402 and, in some embodiments, is adjacent to the first HVMOS device 106A. Further, the peripheral contact region 408 has the same doping type as, but a higher doping concentration than, the peripheral well 404. In some embodiments, the peripheral contact region 408 is electrically coupled to ground and/or or a cathode of a low voltage power supply.

The shared drift well 112 and the bootstrap body well 114 are in the semiconductor substrate 402 and overlie the bulk semiconductor region 402B. Further, the bootstrap MOS device 102 is on the shared drift well 112 and the bootstrap body well 114. The bootstrap MOS device 102 is a LDMOS transistor or some other MOS device. The shared drift well 112 underlies and laterally surrounds the bootstrap body well 114, such that the shared drift well 112 spaces (e.g., completely spaces) the bootstrap body well 114 from the bulk semiconductor region 402B and the peripheral well 404. Further, the shared drift well 112 has an opposite doping type as the peripheral well 404 and the bootstrap body well 114. The bootstrap body well 114 has the same doping type as the peripheral well 404 and, in some embodiments, the bulk semiconductor region 402B. In some embodiments, the isolation structure 406 covers a boundary along which the shared drift well 112 contacts the peripheral well 404.

The second bootstrap source/drain region 118 overlies the shared drift well 112, closer to the high side area 108 than the first bootstrap source/drain region 116. The first bootstrap source/drain region 116 and the bootstrap body contact region 120 overlie the bootstrap body well 114, such that the first bootstrap source/drain region 116 is between the bootstrap body contact region 120 and the second bootstrap source/drain region 118. In some embodiments, the first bootstrap source/drain region 116 and the bootstrap body contact region 120 are laterally separated by the isolation structure 406. The first and second bootstrap source/drain regions 116, 118 are laterally separated by the shared drift well 112, the bootstrap body well 114, and the isolation structure 406. The first bootstrap source/drain region 116, the second bootstrap source/drain region 118, and the bootstrap body contact region 120 are in the semiconductor substrate 402. The first and second bootstrap source/drain regions 116, 118 have the same doping type as, but a higher doping concentration than, the shared drift well 112. The bootstrap body contact region 120 has the same doping type as, but a higher doping concentration than, the bootstrap body well 114. In some embodiments, the first bootstrap source/drain region 116 and the bootstrap body contact region 120 are electrically coupled together. Further, in some embodiments, the bootstrap body contact region 120 is electrically coupled to ground and/or a cathode of a low voltage power supply.

In some embodiments, a bootstrap drift well 410 overlies the bootstrap body well 114, and further underlies the first bootstrap source/drain region 116, to space (e.g., completely space) the first bootstrap source/drain region 116 from the bootstrap body well 114. In other embodiments, the bootstrap drift well 410 is omitted. The bootstrap drift well 410 is in the semiconductor substrate 402 and has the same doping type as, but a lesser doping concentration than, the first bootstrap source/drain region 116. Further, the bootstrap drift well 410 is spaced (e.g., completely spaced) from the shared drift well 112 by the bootstrap body well 114.

A selectively-conductive bootstrap channel 412 is in the bootstrap body well 114. The selectively-conductive bootstrap channel 412 extends along a top surface of the semiconductor substrate 402, from the shared drift well 112 towards the first bootstrap source/drain region 116. In some embodiments in which the bootstrap drift well 410 is present, the selectively-conductive bootstrap channel 412 extends from the shared drift well 112 to the bootstrap drift well 410. In some embodiments in which the bootstrap drift well 410 is omitted, the selectively-conductive bootstrap channel 412 extends from the shared drift well 112 to the first bootstrap source/drain region 116. The isolation structure 406 overlies the shared drift well 112, between the selectively-conductive bootstrap channel 412 and the second bootstrap source/drain region 118. Further, the isolation structure 406 has a width W at the shared drift well 112. The width W may be, for example, about 50-200 micrometers, about 75-125 micrometers, or about 100 micrometers.

The bootstrap gate electrode 122 overlies the selectively-conductive bootstrap channel 412 and the isolation structure 406. Further, the bootstrap gate electrode 122 extends along a sidewall of the isolation structure 406 from overlying the selectively-conductive bootstrap channel 412 to overlying the isolation structure 406. The selectively-conductive bootstrap channel 412 selectively conducts depending upon whether a voltage from the bootstrap gate electrode 122 to the first bootstrap source/drain region 116 exceeds a threshold voltage. Further, the bootstrap gate electrode 122 is electrically insulated from the selectively-conductive bootstrap channel 412 by a bootstrap gate dielectric layer 414. The bootstrap gate dielectric layer 414 may be or comprise, for example, silicon oxide, hafnium oxide, or some other dielectric material. In some embodiments, a bootstrap field plate 416 borders the second bootstrap source/drain region 118. The bootstrap field plate 416 extends along a sidewall of the isolation structure 406 and overlies the isolation structure 406. In some embodiments, the bootstrap field plate 416 is electrically coupled to the second bootstrap source/drain region 118. The bootstrap field plate 416 may be or comprise, for example, doped polysilicon, metal, or some other conductive material.

A third bootstrap source/drain region 138 overlies the bootstrap body well 114, such that the bootstrap body contact region 120 is sandwiched between the first bootstrap source/drain region 116 and the third bootstrap source/drain region 138. In some embodiments, the third bootstrap source/drain region 138 and the bootstrap body contact region 120 are laterally separated by the isolation structure 406. The third bootstrap source/drain region 138 is in the semiconductor substrate 402 and has the same doping type as, but a higher doping concentration than, the shared drift well 112. In some embodiments, the third bootstrap source/drain region 138 and the first bootstrap source/drain region 116 are electrically coupled together. In some embodiments, the third bootstrap source/drain region 138 and the bootstrap body contact region 120 are electrically coupled together.

In some embodiments, a second bootstrap drift well 420 overlies the bootstrap body well 114, and further underlies the third bootstrap source/drain region 138, to space (e.g., completely space) the third bootstrap source/drain region 138 from the bootstrap body well 114. In other embodiments, the second bootstrap drift well 420 is omitted. The second bootstrap drift well 420 has the same doping type as, but a lesser doping concentration than, the third bootstrap source/drain region 138. Further, the second bootstrap drift well 420 is spaced (e.g., completely spaced) from the shared drift well 112 by the bootstrap body well 114.

A second selectively-conductive bootstrap channel 422 is in the bootstrap body well 114. The second selectively-conductive bootstrap channel 422 extends along a top surface of the semiconductor substrate 402, from the shared drift well 112 towards the third bootstrap source/drain region 138. In some embodiments in which the second bootstrap drift well 420 is present, the second selectively-conductive bootstrap channel 422 extends from the shared drift well 112 to the second bootstrap drift well 420. In some embodiments in which the second bootstrap drift well 420 is omitted, the second selectively-conductive bootstrap channel 422 extends from the shared drift well 112 to the third bootstrap source/drain region 138.

A second bootstrap gate electrode 140 overlies the second selectively-conductive bootstrap channel 422 and the isolation structure 406. Further, the second bootstrap gate electrode 140 extends along a sidewall of the isolation structure 406 from overlying the second selectively-conductive bootstrap channel 422 to overlying the isolation structure 406. The second selectively-conductive bootstrap channel 422 selectively conducts depending upon whether a voltage from the second bootstrap gate electrode 140 to the third bootstrap source/drain region 138 exceeds a threshold voltage. Further, the second bootstrap gate electrode 140 is electrically insulated from the second selectively-conductive bootstrap channel 422 by a second bootstrap gate dielectric layer 426.

The second bootstrap gate dielectric layer 426 may be or comprise, for example, silicon oxide, hafnium oxide, or some other dielectric material. In some embodiments, the second bootstrap gate electrode 140 is electrically coupled to the bootstrap gate electrode 122. The second bootstrap gate electrode 140 may be or comprise, for example, doped polysilicon, metal, or some other conductive material.

During operation of the bootstrap MOS device 102, the bootstrap MOS device 102 may be selectively switched between a blocking state and a non-blocking state. For example, the bootstrap MOS device 102 may be switched to the non-blocking state to charge a bootstrap capacitor (not shown) while a high-side gate driver (not shown) at the high side area 108 is in an OFF state. As another example, the bootstrap MOS device 102 may be switched to the blocking state while the high-side gate driver is in an ON state. The bootstrap MOS device 102 is switched to the non-blocking state by biasing the bootstrap gate electrode 122 and the second bootstrap gate electrode 140 so the selectively-conductive bootstrap channel 412 and the second selectively-conductive bootstrap channel 422 conduct. In such instances, the bootstrap MOS device 102 is conductive from the first and third source/drain regions 116, 138 to the second source/drain region 118. Further, the bootstrap MOS device 102 is switched to the non-blocking state by biasing the bootstrap gate electrode 122 and the second bootstrap gate electrode 140 so the selectively-conductive bootstrap channel 412 and the second selectively-conductive bootstrap channel 422 do not conduct. In such instances, the bootstrap MOS device 102 is non-conductive from the first and third source/drain regions 116, 138 to the second source/drain region 118.

As discussed in FIG. 2, a diode may alternatively be used in place of the bootstrap MOS device 102 to facilitate charging of a bootstrap capacitor. However, the diode is slow to change between the blocking state and the non-blocking state, thereby limiting the speed at which a bootstrap capacitor may be charged. In contrast, the bootstrap MOS device 102 is fast to switch between the blocking and non-blocking states, whereby the bootstrap MOS device 102 enables fast charging of the bootstrap capacitor. Further, by having two selectively-conductive channels, the bootstrap MOS device 102 can carry a larger amount of current than if it had a single selectively-conductive channel. Carrying a larger amount of current further enable faster charging of the bootstrap capacitor.

While the bootstrap MOS device 102 is in the blocking state, the shared drift well 112 and, in some embodiments, the first and/or second bootstrap drift well(s) 410, 420 act as resistor(s) to absorb the high electric field associated with high voltages, thereby allowing the bootstrap MOS device 102 to sustain operation at high voltages. In some embodiments, the shared drift well 112 is widened to increase the separation between the bootstrap body well 114 and the second bootstrap source/drain region 118, thereby increasing resistance and hence increasing the voltages at which the bootstrap MOS device 102 can sustain operation. In such embodiments, the width W of the isolation structure 406 on the shared drift well 112 is increased with the shared drift well 112. In some embodiments, the doping concentration of the shared drift well 112 is reduced, thereby increasing resistance and hence increasing the voltages at which the bootstrap MOS device 102 can sustain operation. A challenge with widening the shared drift well 112 and/or decreasing the doping concentration of the shared drift well 112 is that the resistance of the bootstrap MOS device 102 in the non-blocking state may become high and power efficiency may become low. Further, a challenge with widening the shared drift well 112 is that IC chip area consumed by the bootstrap MOS device 102 may become high.

In some embodiments, the bootstrap body well 114 comprises a protrusion 114P protruding laterally towards the high side area 108. The protrusion 114P results in an alternating stack of n-type and p-type semiconductor regions that define a shared reduced surface field (RESURF) structure 428 with multiple PN junctions. As seen hereafter, the shared RESURF structure 428 is shared between the bootstrap MOS device 102 and the HVJT device 104. The multiple PN junctions comprise: 1) a first PN junction at a boundary between a bottom surface of the protrusion 114P and the shared drift well 112; and 2) a second PN junction at a boundary between a top surface of the protrusion 114P and the shared drift well 112. In some embodiments, the multiple PN junctions further comprise a third PN junction at a boundary between the bulk semiconductor region 402B and the shared drift well 112. The shared RESURF structure 428 distributes the high electric field associated with high voltages, such that the maximum electric field is low in the blocking state. For example, the high electric field may be vertically distributed across the multiple PN junctions, and/or may be laterally distributed from the second bootstrap source/drain region 118 to the bootstrap body well 114. This, in turn, allows the bootstrap MOS device 102 to sustain operation at high voltages. Further, the shared RESURF structure 428 does not depend upon a high resistance from the second bootstrap source/drain region 118 to the bootstrap body well 114, such that IC chip area may be low and the resistance of the bootstrap MOS device 102 in the non-blocking state may be low.

The HVJT device 104 is or comprises a diode. A PN junction of the diode is defined by the shared drift well 112 and the peripheral well 404. Further, a cathode of the diode is defined by the second bootstrap source/drain region 118, and an anode of the diode is defined by a contact region (e.g., the peripheral contact region 408) on the peripheral well 404, or vice versa. The diode is capable of sustained operation at the high voltage level due to the shared RESURF structure 428 and the large separation between the peripheral well 404 and the second bootstrap source/drain region 118. Because the HVJT device 104 is defined in part by the shared drift well 112, and the shared drift well 112 is shared between the bootstrap MOS device 102 and the HVJT device 104, the HVJT device 104 and the bootstrap MOS device 102 overlap.

The HVMOS drift well 124 and the HVMOS body well 126 are in the semiconductor substrate 402 and overlie the bulk semiconductor region 402B. Further, the first HVMOS device 106A is on the HVMOS drift well 124 and the HVMOS body well 126. The first HVMOS device 106A is a LDMOS transistor or some other MOS device. The HVMOS drift well 124 underlies and laterally surrounds the HVMOS body well 126, such that the HVMOS drift well 124 spaces (e.g., completely spaces) the HVMOS body well 126 from the bulk semiconductor region 402B and the peripheral well 404. Further, the HVMOS drift well 124 has an opposite doping type as the peripheral well 404 and the HVMOS body well 126. The HVMOS body well 126 has the same doping type as the peripheral well 404 and, in some embodiments, the bulk semiconductor region 402B. In some embodiments, the isolation structure 406 covers a boundary along which the HVMOS drift well 124 contacts the peripheral well 404.

The second HVMOS source/drain region 130 overlies the HVMOS drift well 124, closer to the high side area 108 than the first HVMOS source/drain region 128. The first HVMOS source/drain region 128 and the HVMOS body contact region 132 overlie the HVMOS body well 126, such that the first HVMOS source/drain region 128 is between the HVMOS body contact region 132 and the second HVMOS source/drain region 130. The first and second HVMOS source/drain regions 128, 130 are laterally separated by the HVMOS drift well 124, the HVMOS body well 126, and the isolation structure 406. The first HVMOS source/drain region 128, the second HVMOS source/drain region 130, and the HVMOS body contact region 132 are in the semiconductor substrate 402. The first and second HVMOS source/drain regions 128, 130 have the same doping type as, but a higher doping concentration than, the HVMOS drift well 124. The HVMOS body contact region 132 has the same doping type as, but a higher doping concentration than, the HVMOS body well 126. In some embodiments, the first HVMOS source/drain region 128 and the HVMOS body contact region 132 are electrically coupled.

A selectively-conductive HVMOS channel 430 is in the HVMOS body well 126. The selectively-conductive HVMOS channel 430 extends along a top surface of the semiconductor substrate 402, from the HVMOS drift well 124 to the first HVMOS source/drain region 128. The isolation structure 406 overlies the HVMOS drift well 124, between the selectively-conductive HVMOS channel 430 and the second HVMOS source/drain region 130. Further, in some embodiments, the isolation structure 406 has the width W at the HVMOS drift well 124.

The HVMOS gate electrode 134 overlies the selectively-conductive HVMOS channel 430 and the isolation structure 406. Further, the HVMOS gate electrode 134 extends along a sidewall of the isolation structure 406 from overlying the selectively-conductive HVMOS channel 430 to overlying the isolation structure 406. The selectively-conductive HVMOS channel 430 selectively conducts depending upon whether a voltage from the HVMOS gate electrode 134 to the first HVMOS source/drain region 128 exceeds a threshold voltage. Further, the HVMOS gate electrode 134 is electrically insulated from the selectively-conductive HVMOS channel 430 by a HVMOS gate dielectric layer 432. The HVMOS gate dielectric layer 432 may be or comprise, for example, silicon oxide, hafnium oxide, or some other dielectric material. In some embodiments, a HVMOS field plate 434 borders the second HVMOS source/drain region 130. The HVMOS field plate 434 extends along a sidewall of the isolation structure 406 and overlies the isolation structure 406. In some embodiments, the HVMOS field plate 434 is electrically coupled to the second HVMOS source/drain region 130. The HVMOS field plate 434 may be or comprise, for example, doped polysilicon, metal, or some other conductive material.

During operation of the first HVMOS device 106A, the first HVMOS device 106A may be selectively switched between a blocking state and a non-blocking state. While in the block state, the HVMOS drift well 124 acts as resistor to absorb the high electric field associated with high voltages (e.g., voltages between about 300-1200 volts), thereby allowing the first HVMOS device 106A to sustain operation at the high voltages. In some embodiments, the HVMOS drift well 124 is widened to increase the separation between the HVMOS body well 126 and the second HVMOS source/drain region 130, thereby increasing resistance and hence increasing the voltages at which the first HVMOS device 106A can sustain operation. In such embodiments, the width W of the isolation structure 406 on the HVMOS drift well 124 is increased with the HVMOS drift well 124. In some embodiments, the doping concentration of the HVMOS drift well 124 is reduced, thereby increasing resistance and hence increasing the voltages at which the first HVMOS device 106A can sustain operation. A challenge with widening the HVMOS drift well 124 and/or decreasing the doping concentration of the HVMOS drift well 124 is that the resistance of the first HVMOS device 106A in the non-blocking state may become high and power efficiency may become low. Further, a challenge with widening the HVMOS drift well 124 is that IC chip area consumed by the first HVMOS device 106A may become high.

In some embodiments, the HVMOS body well 126 comprises a protrusion 126P protruding laterally towards the high side area 108. The protrusion 126P results in an alternating stack of n-type and p-type semiconductor regions that define an HVMOS RESURF structure 436 with multiple PN junctions. The multiple PN junctions comprise: 1) a first PN junction at a boundary between a bottom surface of the protrusion 126P and the HVMOS drift well 124; and 2) a second PN junction at a boundary between a top surface of the protrusion 126P and the HVMOS drift well 124. In some embodiments, the multiple PN junctions further comprise a third PN junction at a boundary between the bulk semiconductor region 402B and the HVMOS drift well 124. The HVMOS RESURF structure 436 laterally and vertically distributes the high electric field associated with high voltages, such that the maximum electric field is low in the blocking state. For example, the high electric field is vertically distributed across the multiple PN junctions, and/or is laterally distributed from the second HVMOS source/drain region 130 to the HVMOS body well 126. This, in turn, allows the first HVMOS device 106A to sustain operation at high voltages. Further, the HVMOS RESURF structure 436 does not depend upon a high resistance from the second HVMOS source/drain region 130 to the HVMOS body well 126, such that IC chip area may be low and the resistance of the first HVMOS device 106A in the non-blocking state may be low.

A high side well 438 overlies the shared drift well 112 at the high side area 108, such that the shared drift well 112 spaces (e.g., completely spaces) the high side well 438 from the bulk semiconductor region 402B, the peripheral well 404, and the bootstrap body well 114. Further, a high side contact region 440 overlies the high side well 438, such that the high side contact region 440 is separated from the shared drift well 112 by the high side well 438 and/or the isolation structure 406. The high side contact region 440 comprises a pair of segments on opposite sides of the high side well 438. Further, in some embodiments, when viewed top down, the high side contact region 440 extends laterally along a boundary of the high side well 438 in a closed path and/or has a ring-shape. Note this is not visible within the cross-sectional-sectional view 400A of FIG. 4A. The high side well 438 and the high side contact region 440 are in the semiconductor substrate 402 and have an opposite doping type as the shared drift well 112. Further, the high side contact region 440 has a higher doping concentration than the high side well 438.

In some embodiments, a spiral structure 442 overlies the isolation structure 406 on the shared drift well 112 and the HVMOS drift well 124. When viewed top down, the spiral structure 442 extends laterally and continuously in a spiral over the isolation structure 406. Note this is not visible within the cross-sectional-sectional view 400A of FIG. 4A. The spiral structure 442 may, for example, serve as a field plate to manipulate (e.g., increase or decrease) carrier mobility thereunder. In some embodiments, a first end of the spiral structure 442 is electrically coupled to the peripheral contact region 408 and/or ground. In some embodiments, a second end of the spiral structure 442, opposite the first end, is electrically coupled to the high side contact region 440 or the second bootstrap source/drain region 118. The spiral structure 442 may be or comprise, for example, doped polysilicon, metal, or some other conductive material.

Conductive wires 444 and conductive vias 446 are stacked over the semiconductor substrate 402 and define conductive paths. For ease of illustration, only some of the conductive wires 444 are labeled 444, and only some of the conductive vias 446 are labeled 446. The conductive paths provide electrically coupling between the various contact regions (e.g., the peripheral contact region 408), the various fields plates (e.g., the bootstrap field plate 416), the various gate electrodes (e.g., the HVMOS gate electrode 134), the various source/drain regions (e.g., the first bootstrap source/drain region 116), and the spiral structure 442. For example, one of the conductive paths may electrically couple the first HVMOS source/drain region 128 to the HVMOS body contact region 132. The conductive wires 444 and the conductive vias 446 may be or comprise, for example, copper, aluminum copper, aluminum, tungsten, some other conductive material, or any combination of the foregoing.

While FIG. 4A illustrates and describes the first HVMOS device 106A, it is to be understand that the second HVMOS device 106B of FIG. 1B may, for example, be as the first HVMOS device 106A is illustrated and described in FIG. 4A. More generally, each HVMOS device described herein may, for example, be as the first HVMOS device 106A is illustrated and described in FIG. 4A.

With reference to FIG. 4B, another cross-sectional view 400B of some embodiments of the IC of FIG. 4A is provided. The other cross-sectional view 400B may, for example, be taken along line B-B' in FIG. 1B. As illustrated, the bootstrap MOS device 102 of FIG. 4A is on opposite sides of the high side area 108, and the HVJT device 104 of FIG. 4A is on opposite sides of the high side area 108. Further, the first HVMOS device 106A of FIG. 4A and the isolation ring 136 of FIG. 4A are not visible (i.e., outside the other cross-sectional view 400B).

Figure 5A:
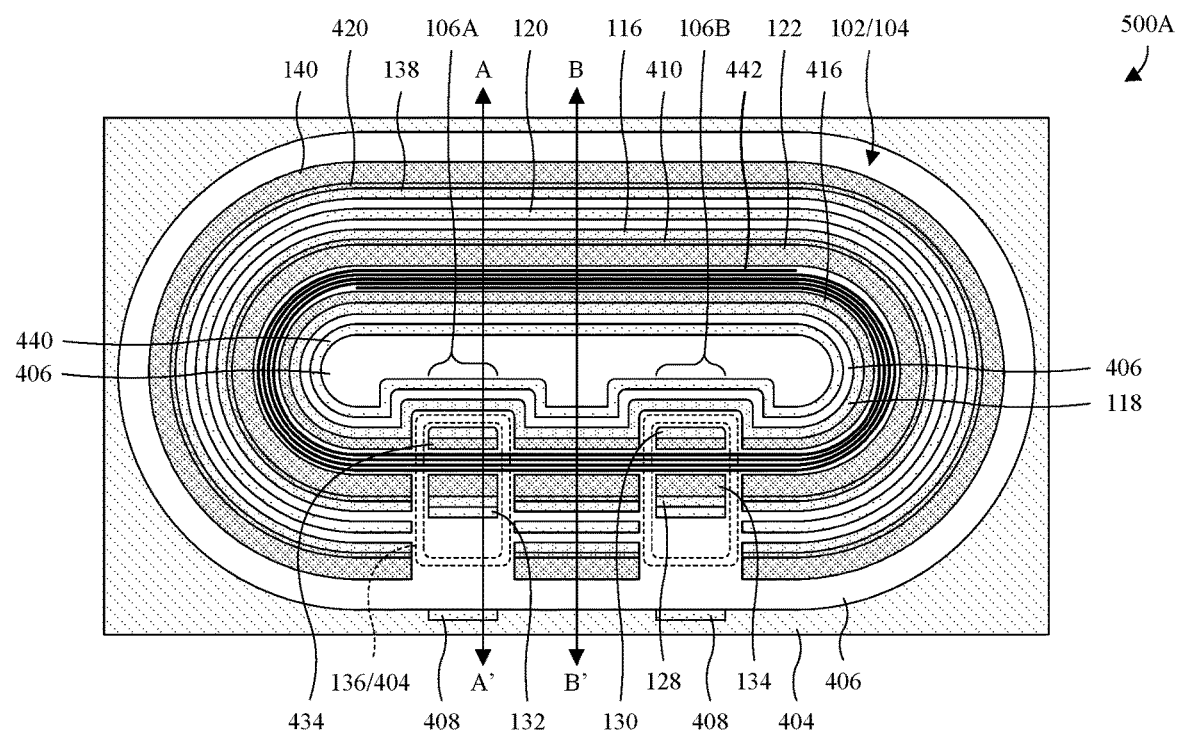
FIGS. 5A and 5B illustrate various top layouts of some embodiments of the IC of FIGS. 4A and 4B.

With reference to FIG. 5A, a top layout 500A of some embodiments of the IC of FIGS. 4A and 4B is provided. The cross-sectional view 400A of FIG. 4A may, for example, be taken along line A-A' in FIG. 5A, and the cross-sectional view 400B of FIG. 4B may, for example, be taken along line B-B' in FIG. 5A.

As illustrated by FIG. 5A, the high side contact region 440 and the second bootstrap source/drain region 118 are ring shaped. As used herein, ring shaped may be circular ring shaped, square ring shaped, rectangular ring shaped, triangular ring shaped, or some other closed path shape. Further, the high side contact region 440 and the second bootstrap source/drain region 118 conform to the isolation rings 136 of the first and second HVMOS devices 106A, 106B. In some embodiments, the high side contact region 440 and the second bootstrap source/drain region 118 serve as guard rings or pickup rings. In some of such embodiments, the high side contact region 440 is connected to the lowest voltage level in a circuit within which the IC is applied, and the second bootstrap source/drain region 118 is connected to highest voltage level in the circuit, to safeguard devices on the high side well 438 (see FIGS. 4A and 4B) against parasitic latching up and turning on.

Also illustrated by FIG. 5A, the spiral structure 442 extends continuously over the isolation structure 406. In some embodiments, a first end of the spiral structure 442 is electrically coupled to the peripheral contact region 408 and/or ground. In some embodiments, a second end of the spiral structure 442, opposite the first end, is electrically coupled to the high side contact region 440 or the second bootstrap source/drain region 118.

Also illustrated by FIG. 5A, the bootstrap MOS device 102 is largely ring-shaped, except for discontinuities at the first and second HVMOS devices 106A, 106B. Namely, the bootstrap field plate 416, the bootstrap gate electrode 122, the bootstrap drift well 410, the first bootstrap source/drain region 116, the bootstrap body contact region 120, the second bootstrap drift well 420, the third bootstrap source/drain region 138, and the second bootstrap gate electrode 140 each have discontinuities at the first and second HVMOS devices 106A, 106B but are otherwise ring-shaped. As above, ring shaped may be circular ring shaped, square ring shaped, rectangular ring shaped, triangular ring shaped, or some other closed path shape.

Figure 5B:
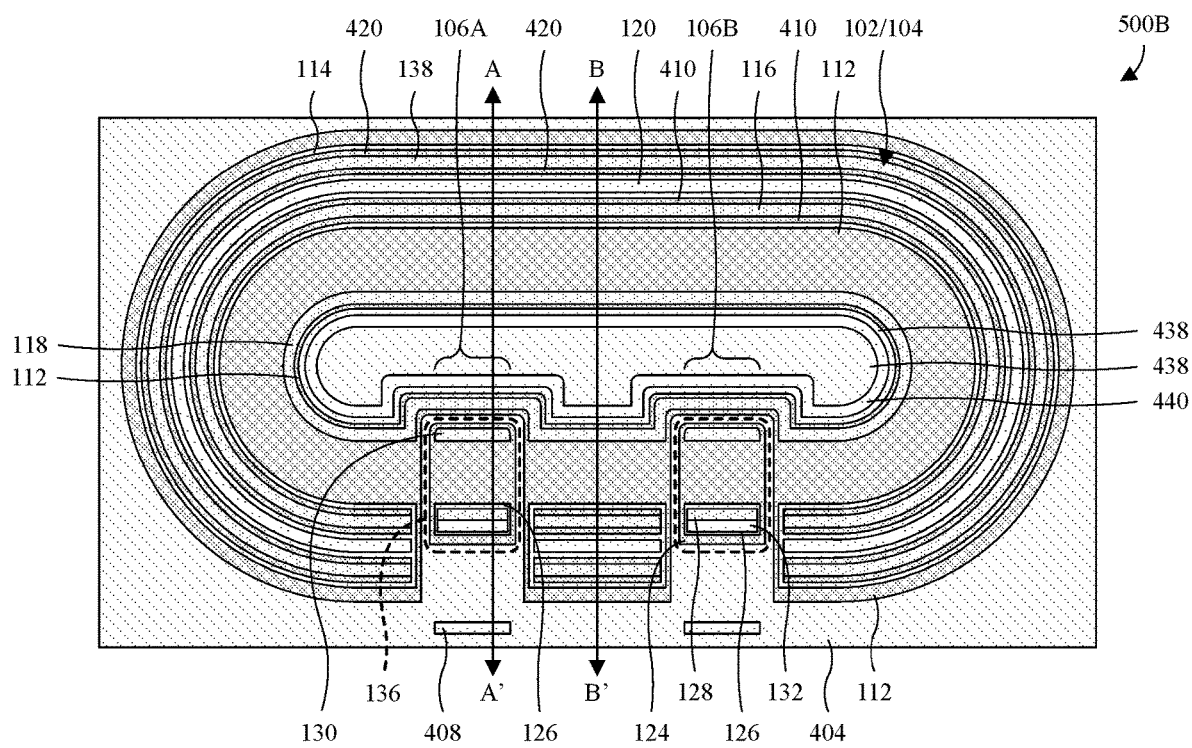

With reference to FIG. 5B, another top layout 500B of some embodiments of the IC of FIGS. 4A and 4B is provided. FIG. 5B is a variant of FIG. 5A in which the isolation structure 406, the various gate electrodes (e.g., the HVMOS gate electrode 134), the various field plates (e.g., the bootstrap field plate 416), and the spiral structure 442 have been removed to show underlying structure. As illustrated, the peripheral well 404 is completely spaced from the HVMOS body wells 126 by the HVMOS drift wells 124. Absent such spacing, the HVMOS body wells 126 would be at about the same voltage as the peripheral well 404, which may be undesirable for certain applications of the first and second HVMOS devices 106A, 106B. Further, the peripheral well 404 completely surrounds the shared drift well 112 and the HVMOS drift wells 124.

The shared drift well 112 is ring shaped and conforms to the isolation rings 136 of the first and second HVMOS devices 106A, 106B. While the shared drift well 112 may be circular ring shaped, the shared drift well 112 may alternatively be square ring shaped, rectangular ring shaped, triangular ring shaped, or some other closed path shape. Further, the shared drift well 112 is completely spaced from the bootstrap drift well 410 and the second bootstrap drift well 420 by the bootstrap body well 114. Absent such spacing, the bootstrap drift well 410 and the second bootstrap drift well 420 would be at about the same voltage as the shared drift well 112, which may be undesirable for certain applications of the bootstrap MOS device 102.

The isolation rings 136 facilitates electrical isolation between the HVMOS drift wells 124 and the shared drift well 112 to enable integration of the first and second HVMOS devices 106A, 106B with the bootstrap MOS device 102 and the HVJT device 104. For example, the isolation rings 136 define diodes with the shared drift well 112 and the HVMOS drift wells 124, and the diodes provide the electrical isolation. The electrical isolation enables the first and second HVMOS devices 106A, 106B to be sandwiched between the shared drift well 112 and the peripheral well 404, which partially define the bootstrap MOS device 102 and the HVJT device 104. For example, the HVJT device 104 is or comprises a diode, and the shared drift well 112 and the peripheral well 404 define a PN junction of the diode. As another example, the shared drift well 112 partially defines a RESURF structure of the bootstrap MOS device 102.

Integration between the first and second HVMOS devices 106A, 106B, the bootstrap MOS device 102, and the HVJT device 104 leads to low IC chip area (e.g., a 25-60% reduction in IC chip area), high reliability, and simplified design iterations. For example, because of the integration, the first and second HVMOS devices 106A, 106B and the bootstrap MOS device 102 are local to the HVJT device 104. As such, electrical coupling between the devices is simplified, which improves reliability and reduces costs. As another example, because of the integration, the first and second HVMOS devices 106A, 106B, the bootstrap MOS device 102, and the HVJT device 104 share a common IC chip area instead of multiple individual IC chip areas. Since wells (e.g., the shared drift well 112) at the common IC chip area may be used for multiple devices (e.g., the bootstrap MOS device 102 and the HVJT device 104), the common IC chip area is smaller than the sum of the individual IC chip areas.

As noted in FIG. 5A, the bootstrap MOS device 102 is largely ring-shaped, except for discontinuities at the first and second HVMOS devices 106A, 106B. In contrast, the HVJT device 104 is ring-shaped. Namely, the HVJT device 104 is or comprises a diode defined at least partially by a PN junction at which the shared drift well 112 contacts the peripheral well 404. Further, the PN junction at which the shared drift well 112 contacts the peripheral well 404 extends continuously in closed, ring-shaped path around the high side area 108 to completely enclose the high side area 108.

With reference to FIG. 6A, a cross-sectional view 600A of some other embodiments of the IC of FIG. 4A is provided in which the IC further comprises (in addition to the features of FIG. 4A) a second bootstrap body well 602 in the semiconductor substrate 402. The second bootstrap body well 602 is adjacent to the bootstrap body well 114, such that the second bootstrap gate electrode 140 is between the second bootstrap body well 602 and the bootstrap body well 114. Further, the second bootstrap body well 602 overlies the shared drift well 112 and is laterally surrounded by the shared drift well 112, such that the shared drift well 112 spaces (e.g., completely spaces) the second bootstrap body well 602 from the bulk semiconductor region 402B and the peripheral well 404. The second bootstrap body well 602 has an opposite doping type as the shared drift well 112, and further has the same doping type as the peripheral well 404 and the bootstrap body well 114. In some embodiments, the second bootstrap body well 602 further has the same doping type as the bulk semiconductor region 402B.

In some embodiments, the shared drift well 112 spaces (e.g., completely spaces) the second bootstrap body well 602 from the bootstrap body well 114. In such embodiments, a second bootstrap body contact region (not shown) overlies the second bootstrap body well 602 in the semiconductor substrate 402. The second bootstrap body contact region has the same doping type as, but a higher doping concentration than, the second bootstrap body well 602. In some embodiments, the second bootstrap body contact region is electrically coupled to the bootstrap body contact region 120. In some embodiments, the second bootstrap body well 602 and the bootstrap body well 114 are one and the same, such that the second bootstrap body well 602 is continuous with the bootstrap body well 114 and vice versa. In such embodiments, a segment of the bootstrap body well 114 (not shown) extends to the second bootstrap body well 602.

A fourth bootstrap source/drain region 604 overlies the second bootstrap body well 602, such that the second bootstrap gate electrode 140 is sandwiched between the third bootstrap source/drain region 138 and the fourth bootstrap source/drain region 604. The fourth bootstrap source/drain region 604 is in the semiconductor substrate 402 and has the same doping type as, but a higher doping concentration than, the shared drift well 112. In some embodiments, the fourth bootstrap source/drain region 604, the first bootstrap source/drain region 116, and the third bootstrap source/drain region 138 are electrically coupled together. Further, in some embodiments, the fourth bootstrap source/drain region 604 and the bootstrap body contact region 120 are electrically coupled together.

In some embodiments, a third bootstrap drift well 606 overlies the second bootstrap body well 602, and further underlies the fourth bootstrap source/drain region 604, to space (e.g., completely space) the fourth bootstrap source/drain region 604 from the second bootstrap body well 602. In other embodiments, the third bootstrap drift well 606 is omitted. The third bootstrap drift well 606 has the same doping type as, but a lesser doping concentration than, the fourth bootstrap source/drain region 604. Further, the third bootstrap drift well 606 is spaced (e.g., completely spaced) from the shared drift well 112 by the second bootstrap body well 602.

A third selectively-conductive bootstrap channel 608 and a fourth selectively-conductive bootstrap channel 610 are in the second bootstrap body well 602. The third and fourth selectively-conductive bootstrap channel 608, 610 are on opposite sides of the second bootstrap body well 602 and each extends along a top surface of the semiconductor substrate 402, from the shared drift well 112 towards the fourth bootstrap source/drain region 604. In some embodiments in which the third bootstrap drift well 606 is present, the third and fourth selectively-conductive bootstrap channel 608, 610 each extends from the shared drift well 112 to the third bootstrap drift well 606. In some embodiments in which the third bootstrap drift well 606 is omitted, the third and fourth selectively-conductive bootstrap channel 608, 610 each extends from the shared drift well 112 to the fourth bootstrap source/drain region 604.

In contrast with FIG. 4A, the second bootstrap gate electrode 140 does not overlap with the isolation structure 406. Further, the second bootstrap gate electrode 140 overlies both the second selectively-conductive bootstrap channel 422 in the bootstrap body well 114 and the third selectively-conductive bootstrap channel 608 in the second bootstrap body well 602. The second selectively-conductive bootstrap channel 422 selectively conducts depending upon whether a voltage from the second bootstrap gate electrode 140 to the third bootstrap source/drain region 138 exceeds a threshold voltage, and the third selectively-conductive bootstrap channel 608 selectively conducts depending upon whether a voltage from the second bootstrap gate electrode 140 to the fourth bootstrap source/drain region 604 exceeds a threshold voltage. In some embodiments, the second bootstrap gate electrode 140 has a rectangular profile, a square profile, or some other suitable profile.

A third bootstrap gate electrode 612 overlies the fourth selectively-conductive bootstrap channel 610 and the isolation structure 406. Further, the third bootstrap gate electrode 612 extends along a sidewall of the isolation structure 406 from overlying the fourth selectively-conductive bootstrap channel 610 to overlying the isolation structure 406. The fourth selectively-conductive bootstrap channel 610 selectively conducts depending upon whether a voltage from the third bootstrap gate electrode 612 to the fourth bootstrap source/drain region 604 exceeds a threshold voltage. Further, the third bootstrap gate electrode 612 is electrically insulated from the fourth selectively-conductive bootstrap channel 610 by a third bootstrap gate dielectric layer 614. The third bootstrap gate dielectric layer 614 may be or comprise, for example, silicon oxide, hafnium oxide, or some other dielectric material. The third bootstrap gate electrode 612 may be or comprise, for example, doped polysilicon, metal, or some other conductive material. In some embodiments, the third bootstrap gate electrode 612, the second bootstrap gate electrode 140, and the bootstrap gate electrode 122 are electrically coupled.

With reference to FIG. 6B, another cross-sectional view 600B of some embodiments of the IC of FIG. 6A is provided. As illustrated, the bootstrap MOS device 102 of FIG. 6A is on opposite sides of the high side area 108, and the HVJT device 104 of FIG. 6A is on opposite sides of the high side area 108. Further, the first HVMOS device 106A of FIG. 6A and the isolation ring 136 of FIG. 6A are not visible (i.e., outside the cross-sectional view 600B).

The addition of two selectively-conductive bootstrap channels (i.e., the third and fourth selectively-conductive bootstrap channels 608, 610) increases the amount of current that the bootstrap MOS device 102 can sustain operation at. This may, for example, allow the bootstrap MOS device 102 to more rapidly charge a bootstrap capacitor. Further, it should be appreciated that even more selectively-conductive bootstrap channels can be added to the bootstrap MOS device 102. For example, an additional bootstrap body well, an additional bootstrap source/drain region, an additional bootstrap gate electrode, and an additional bootstrap drift well may be added to the bootstrap MOS device 102 of FIGS. 6A and 6B in the same manner that the second bootstrap body well 602, the fourth bootstrap source/drain region 604, the third bootstrap gate electrode 612, and the third bootstrap drift well 606 were added to the bootstrap MOS device 102 of FIGS. 4A and 4B. This may be repeated as necessary to achieve the desired number of selectively-conductive bootstrap channels.

Figure 7A:
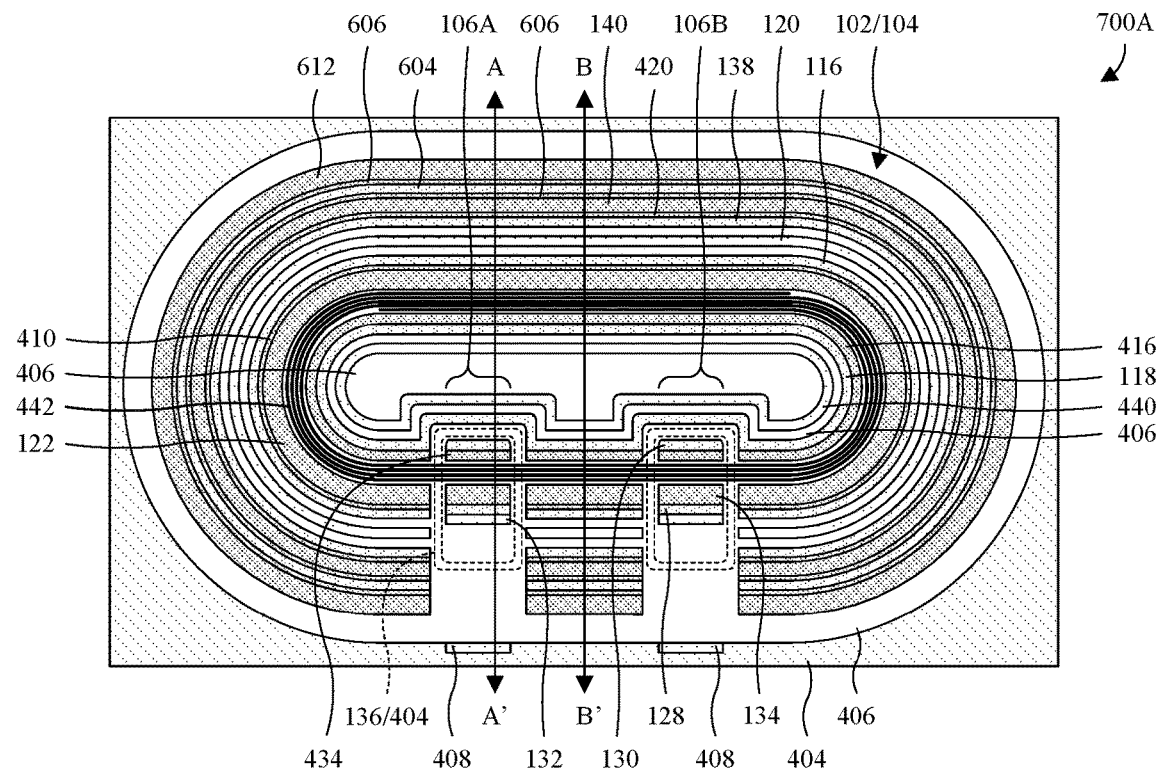
FIGS. 7A and 7B illustrate various top layouts of some embodiments of the IC of FIGS. 6A and 6B.

With reference to FIG. 7A, a top layout 700A of some embodiments of the IC of FIGS. 6A and 6B is provided. The cross-sectional view 600A of FIG. 6A may, for example, be taken along line A-A' in FIG. 7A, and the cross-sectional view 600B of FIG. 6B may, for example, be taken along line B-B' in FIG. 7A. As illustrated, FIG. 7A is a variant of FIG. 5A in which the IC further comprises the fourth bootstrap source/drain region 604, the third bootstrap drift well 606, and the third bootstrap gate electrode 612. The fourth bootstrap source/drain region 604, the third bootstrap drift well 606, and the third bootstrap gate electrode 612 each have discontinuities at the first and second HVMOS devices 106A, 106B but are otherwise ring-shaped. As above, ring shaped may be circular ring shaped, square ring shaped, rectangular ring shaped, triangular ring shaped, or some other closed path shape.

Figure 7B:
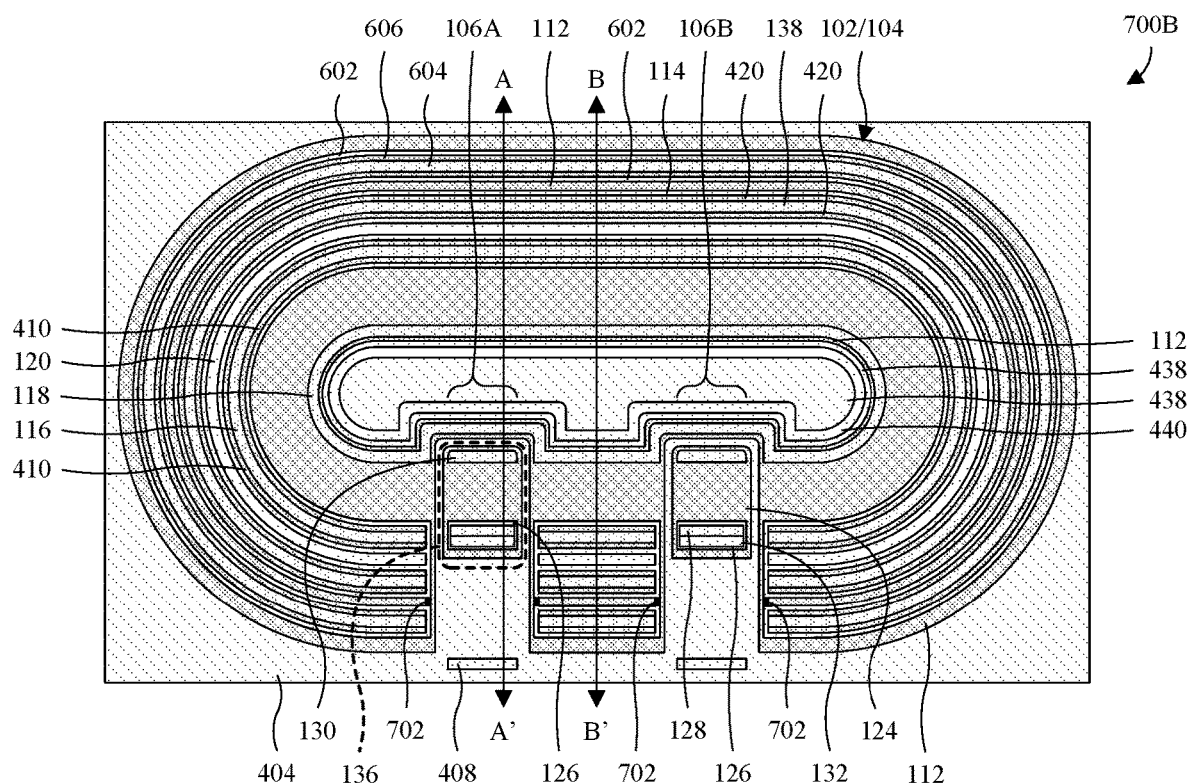

With reference to FIG. 7B, another top layout 700B of some embodiments of the IC of FIGS. 6A and 6B is provided. FIG. 7B is a variant of FIG. 7A in which the isolation structure 406, the various gate electrodes (e.g., the HVMOS gate electrode 134), the various field plates (e.g., the bootstrap field plate 416), and the spiral structure 442 have been removed to show underlying structure. As illustrated, the third bootstrap drift well 410 is completely spaced from the shared drift well 112 by the second bootstrap body well 602. Absent such spacing, the third bootstrap drift well 410 would be at about the same voltage as the shared drift well 112, which may be undesirable for certain applications of the bootstrap MOS device 102.

In some embodiments, the second bootstrap body well 602 and the bootstrap body well 114 are one and the same, such that the second bootstrap body well 602 is continuous with the bootstrap body well 114 and vice versa. In such embodiments, semiconductor bridges 702 connect the bootstrap body well 114 and the second bootstrap body well 602 together. The semiconductor bridges 702 are in the semiconductor substrate 402 of FIGS. 6A and 6B and have the same doping type as the bootstrap body well 114 and the second bootstrap body well 602. For ease of illustration, only some of the semiconductor bridges 702 are labeled 702. While not illustrated, the semiconductor bridges 702 may, for example, be distributed in a ring-shaped pattern surrounding the high side well 438. Further, while not illustrated, the semiconductor bridges 702 may be buried in the shared drift well 112, whereby the semiconductor bridges 702 would not be visible in the top layout 700B of FIG. 7B and the space presently occupied by the semiconductor bridges 702 would occupied by the shared drift well 112.

In alternative embodiments, the shared drift well 112 completely spaces the second bootstrap body well 602 from the bootstrap body well 114. In such embodiments, a second bootstrap body contact region (not shown) overlies the second bootstrap body well 602 in the semiconductor substrate 402. Further, in such embodiments, the space presently occupied by the semiconductor bridges 702 is occupied by the shared drift well 112.

Figure 8A:
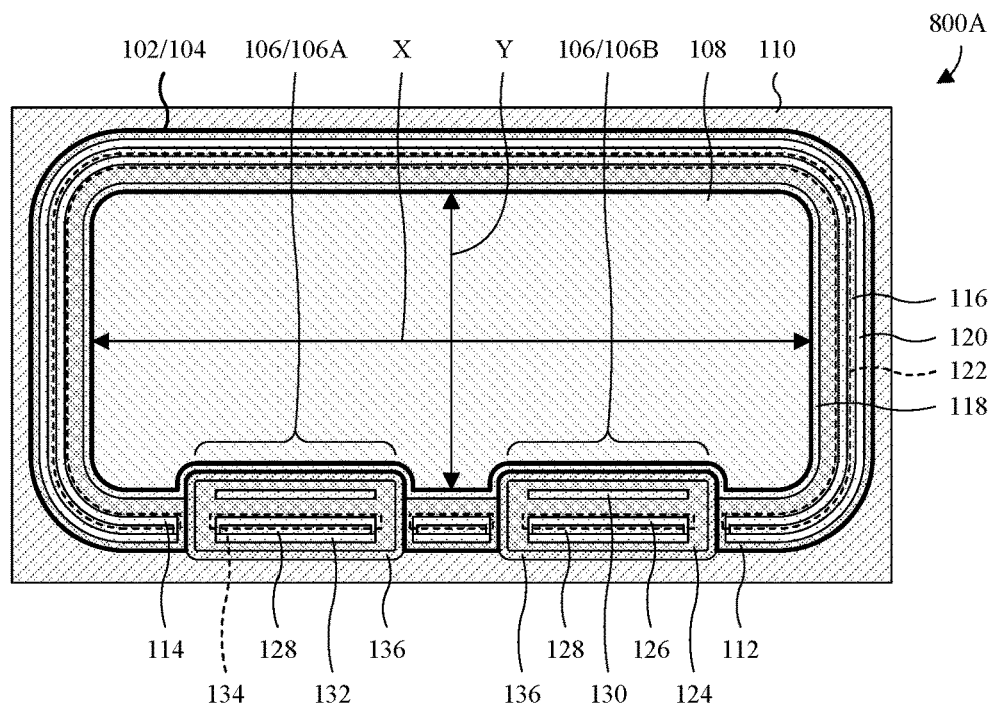
FIGS. 8A and 8B illustrate top layouts of various other embodiments of the IC of FIG. 1A in which a geometry of a high side area is varied.
Figure 8B:
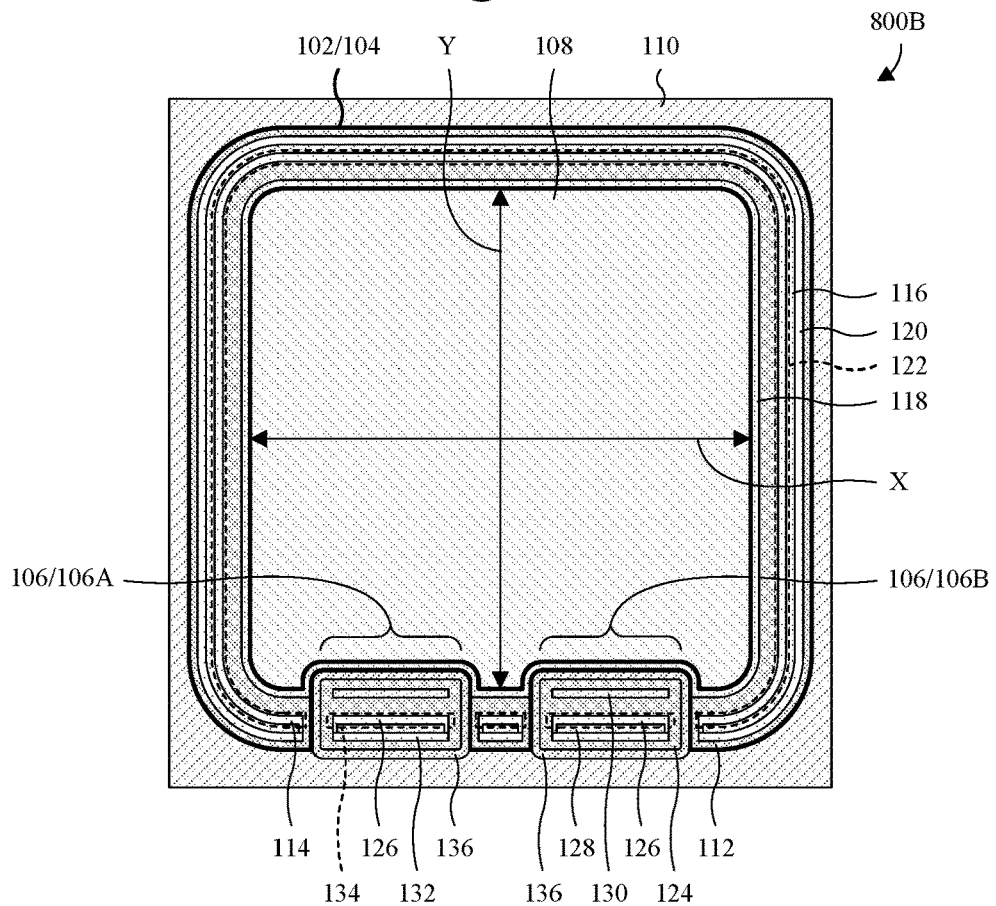

With reference to FIGS. 8A and 8B, top layouts 800A, 800B of various other embodiments of the IC of FIG. 1A are provided in which a geometry of a high side area 108 is scaled in the X dimension and/or the Y dimension to vary the size of the high side area 108. For example, the geometry of the high side area 108 may be scaled to accommodate more or less devices. Because the isolation rings 136 facilitate efficient integration between the bootstrap MOS device 102, the HVJT device 104, and the HVMOS devices 106, the geometry of the high side area 108 may be readily scaled without complex redesigns.

With reference to FIGS. 9A-9D, top layouts 900A-900D of various other embodiments of the IC of FIG. 1A are provided in which geometries of the HVMOS devices 106 are varied according to current handling requirements and voltage handling requirements.

Figure 9A:
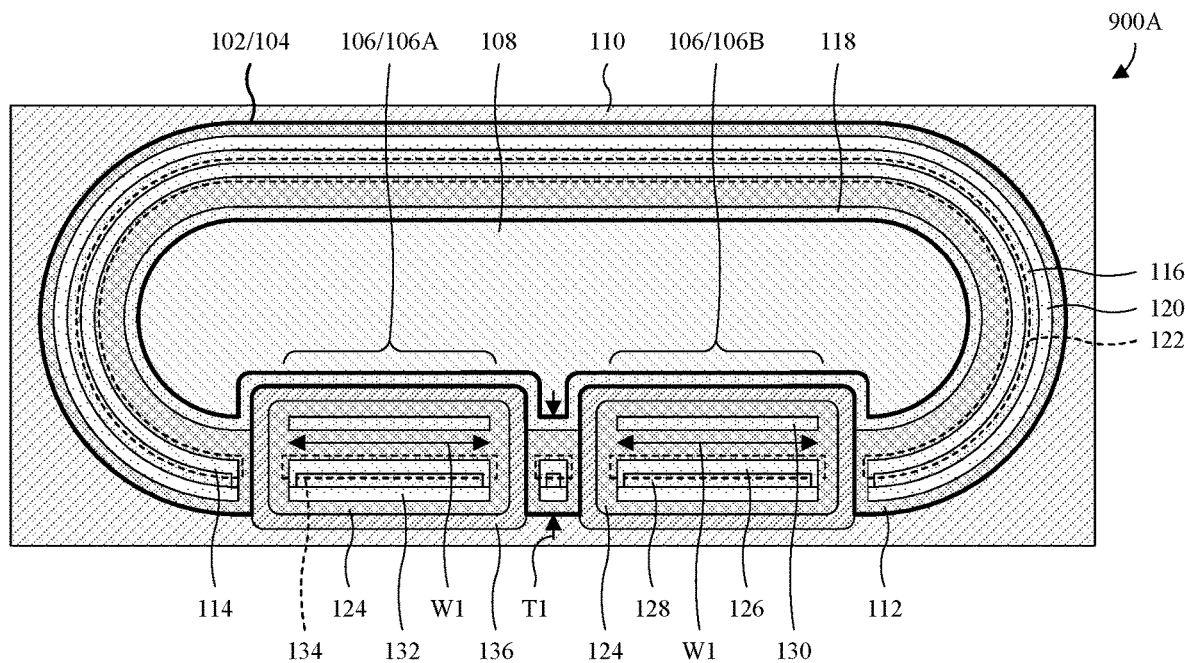
FIGS. 9A-9D illustrate top layouts of various other embodiments of the IC of FIG. 1A in which a geometry of the HVMOS device is varied.
Figure 9B:
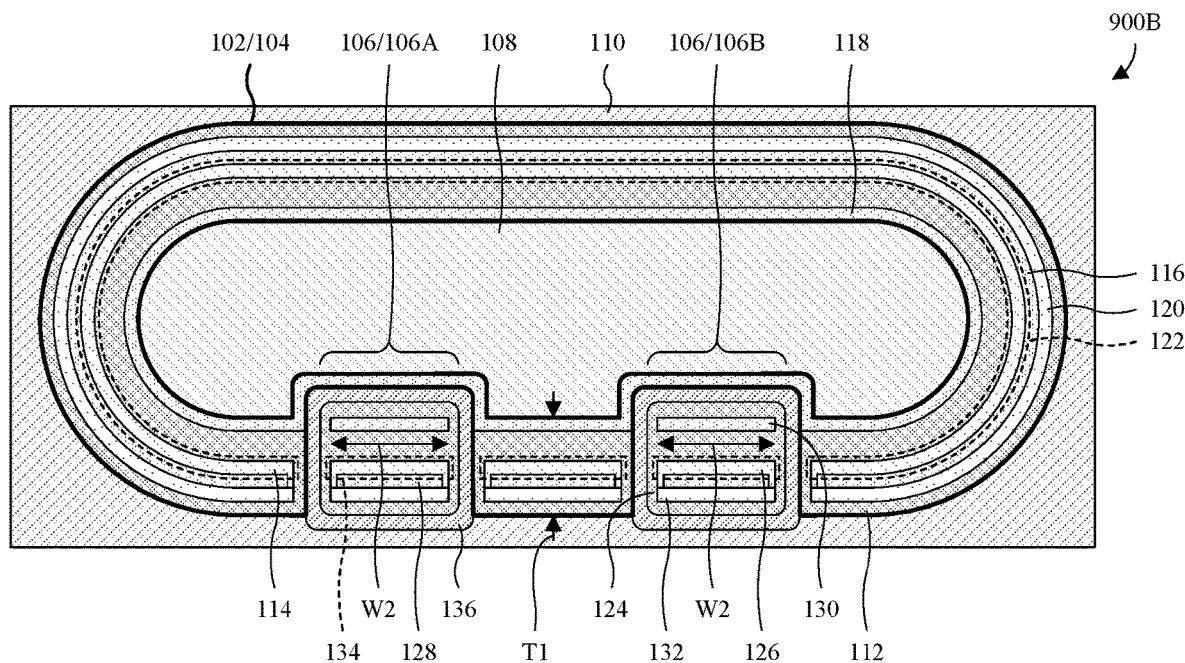

As illustrated by FIGS. 9A and 9B, the HVMOS devices 106 of FIG. 9A have a first width W1, whereas the HVMOS devices 106 of FIG. 9B have a second width W2 less than the first width W1. Increasing a width of the HVMOS devices 106 increases a width of the first and second HVMOS source/drain regions 128, 130, which widens selectively-conductive channels of the HVMOS devices 106 and widens the HVMOS drift wells 124. This increases the source-drain current at which the HVMOS devices 106 can sustain operation. Further, decreasing a width of the HVMOS devices 106 decreases a width of the first and second HVMOS source/drain regions 128, 130, which narrows selectively-conductive channels of the HVMOS devices 106 and narrows the HVMOS drift wells 124. This decreases the source-drain current at which the HVMOS devices 106 can sustain operation. Therefore, because the first width W1 is greater than the second width W2, the HVMOS devices 106 of FIG. 9A can sustain operation at a higher source-drain current than the HVMOS devices 106 of FIG. 9B.

Figure 9C:
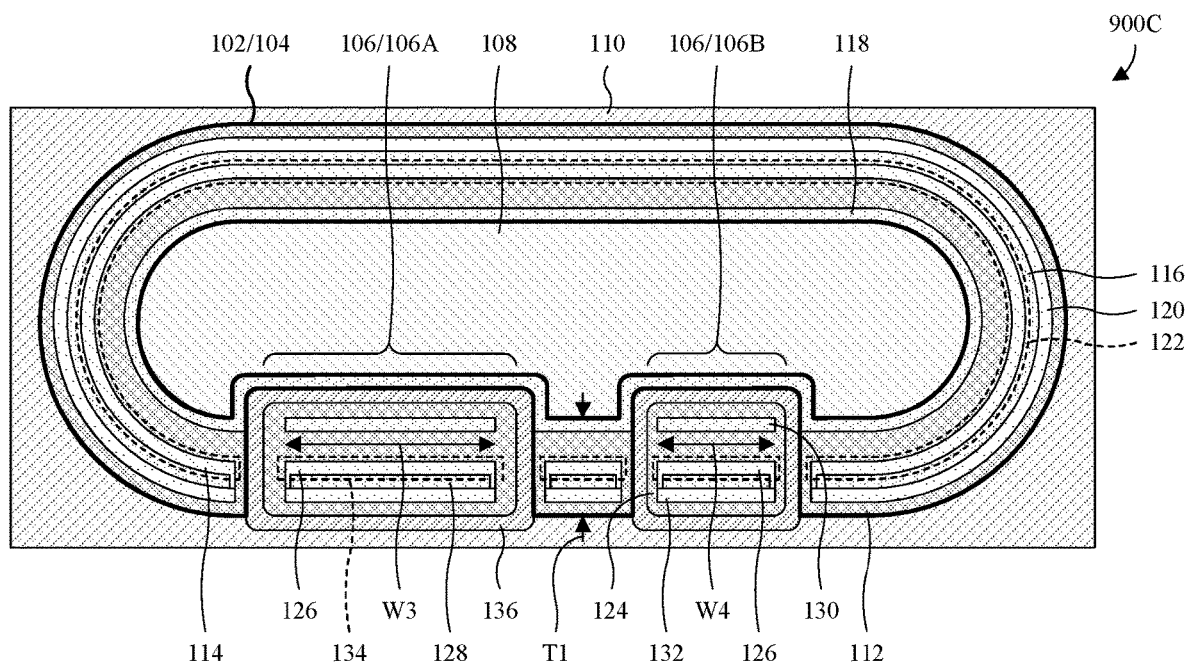
Figure 9D:
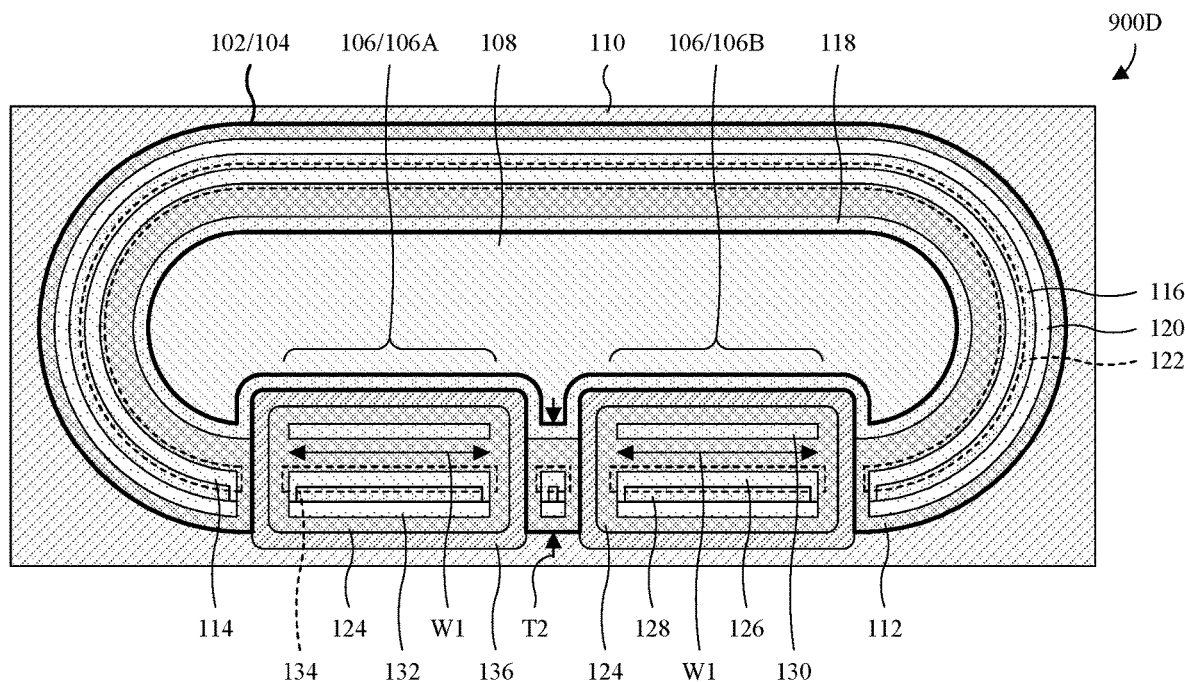

As illustrated by FIG. 9C, the first and second HVMOS devices 106A, 106B respectively have a third width W3 and a fourth width W4, where the fourth width W4 is less than the third width W3. Therefore, the first HVMOS device 106A of FIG. 9C can sustain operation at a higher source-drain current than the second HVMOS device 106B of FIG. 9C.

As illustrated by FIGS. 9A-9D, the bootstrap MOS device 102, the HVJT device 104, and the HVMOS devices 106 collectively define a ring-shaped structure. Within FIGS. 9A-9C, the ring-shaped structure has a first thickness T1. Within FIG. 9D, the ring-shaped structure has a second thickness T2 greater than the first thickness T1. Increasing the thickness of the ring-shaped structure lengthens the HVMOS drift wells 124 and the shared drift well 112, which increases the voltages at which the bootstrap MOS device 102, the HVJT device 104, and the HVMOS devices 106 can sustain operation at. Decreasing the thickness of the ring-shaped structure shortens the HVMOS drift wells 124 and the shared drift well 112, which decreases the voltages at which the bootstrap MOS device 102, the HVJT device 104, and the HVMOS devices 106 can sustain operation at. Therefore, since the first thickness T1 is less than the second thickness T2, the bootstrap MOS device 102 of FIG. 9D, the HVJT device 104 of FIG. 9D, and the HVMOS devices 106 of FIG. 9D can sustain operation at higher voltages respectively than the bootstrap MOS device 102 of FIGS. 9A-9C, the HVJT device 104 of FIGS. 9A-9C, and the HVMOS devices 106 of FIGS. 9A-9C.

Figure 10A:
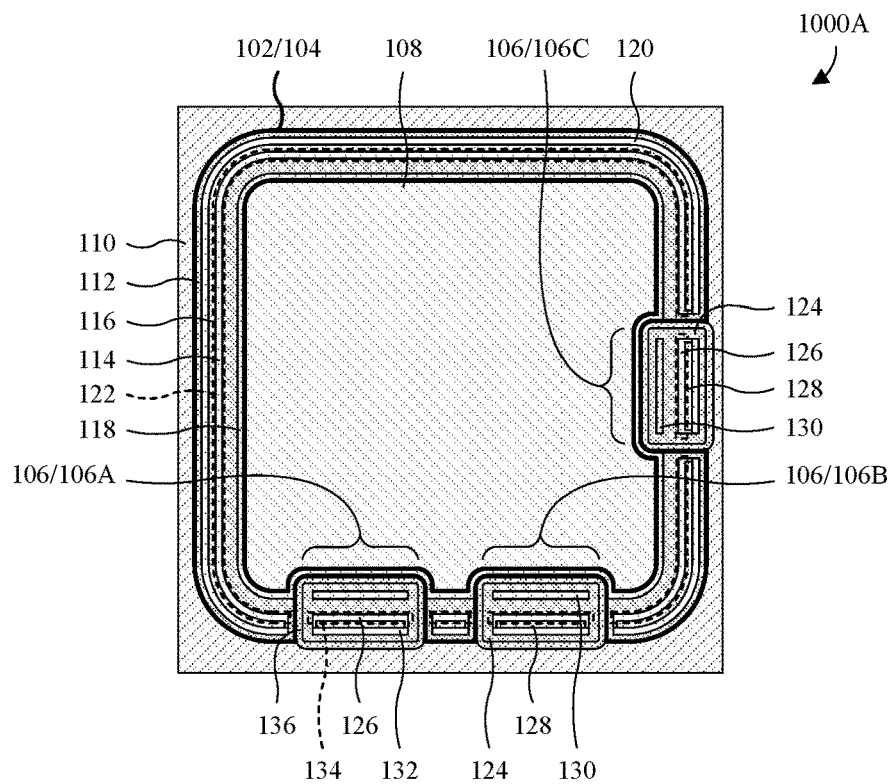
FIGS. 10A and 10B illustrate top layouts of various other embodiments of the IC of FIG. 1A in which more than two HVMOS devices are integrated with the bootstrap MOS device and the HVJT device.
Figure 10B:
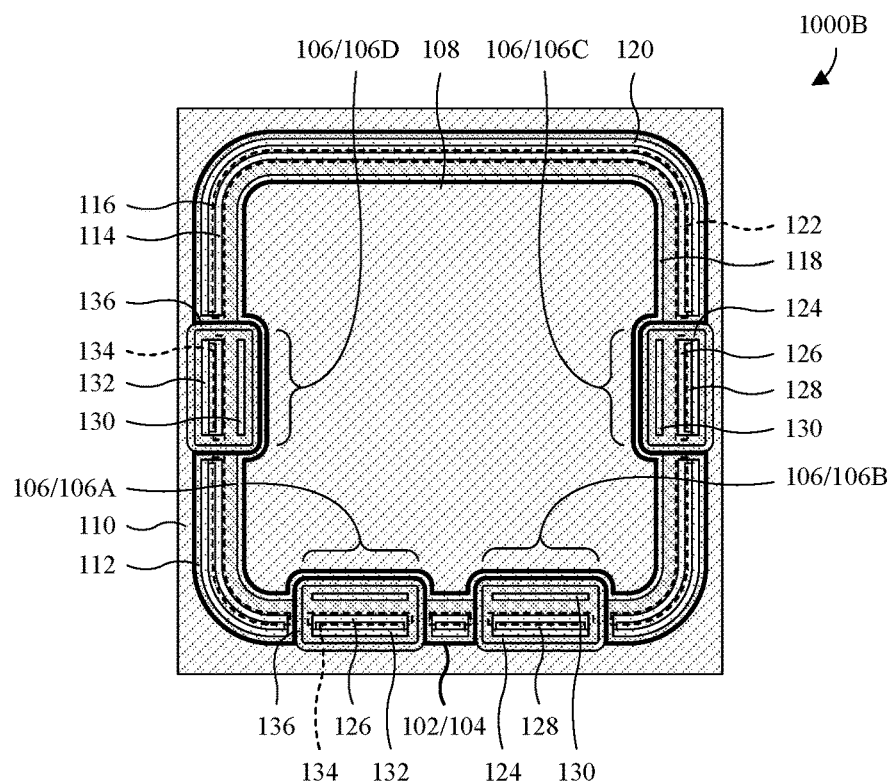

With reference to FIGS. 10A and 10B, top layouts 1000A, 1000B of various other embodiments of the IC of FIG. 1A are provided in which more than two HVMOS devices are integrated with the bootstrap MOS device 102 and the HVJT device 104. As illustrated by FIG. 10A, the HVMOS devices 106 comprise the first and second HVMOS devices 106A, 106B, and further comprise a third HVMOS device 106C. As illustrated by FIG. 10B, the HVMOS devices 106 comprise the first and second HVMOS devices 106A, 106B, and further comprise the third HVMOS device 106C and a fourth HVMOS device 106D. Each of the HVMOS devices 106 may, for example, be as described with regard to FIG. 1A.

Because the isolation rings 136 facilitate efficient integration between the bootstrap MOS device 102, the HVJT device 104, and the HVMOS devices 106, the number of HVMOS devices integrated with the bootstrap MOS device 102 and the HVJT device 104 may be varied without complex redesigns. Further, because the bootstrap MOS device 102, the HVJT device 104, and the HVMOS devices 106 are integrated together, the number of HVMOS devices integrated with the bootstrap MOS device 102 and the HVJT device 104 may be increased without increasing IC chip area.

While FIGS. 8A, 8B, 9A-9D, 10A, and 10B illustrate variations to the IC of FIG. 1A, it is to be understood that the variations may also be applied to the IC of any one of FIGS. 1B, 4A, 4B, 5A, 5B, 6A, 6B, 7A, and 7B.

Figure 11:
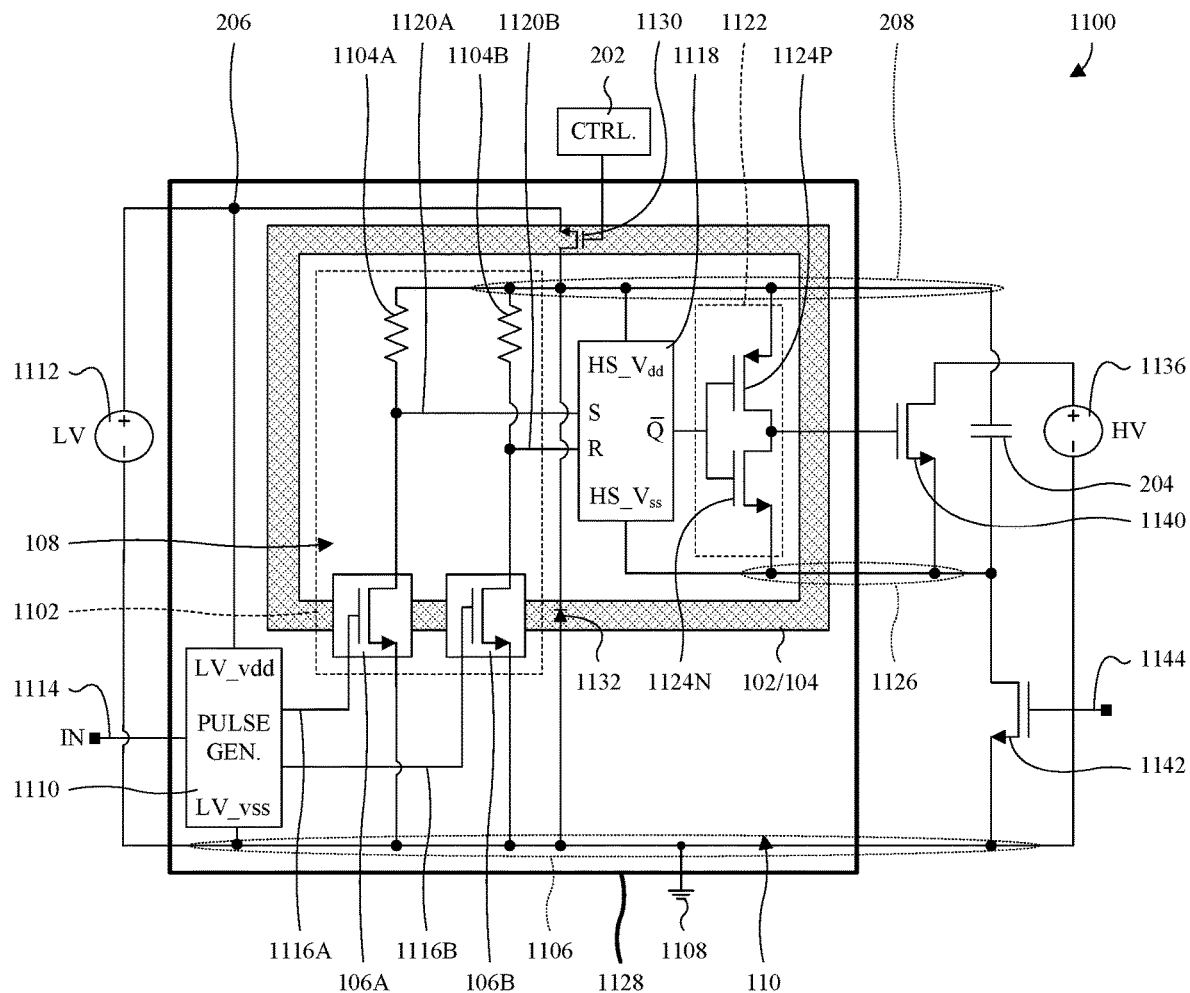
FIG. 11 illustrates a block diagram of some embodiments a gate driver circuit in which the IC of FIG. 1A finds application.

With reference to FIG. 11, a block diagram 1100 of some embodiments of a gate driver circuit in which the IC of any one of FIGS. 1A, 1B, 4A, 4B, 5A, 5B, 6A, 6B, 7A, and 7B finds application. As illustrated, a level shifter 1102 comprises the first HVMOS device 106A and the second HVMOS device 106B, and further comprises a first resistor 1104A and a second resistor 1104B. In some embodiments, the first and second HVMOS devices 106A, 106B are n-channel LDMOS transistors. The first HVMOS device 106A and the first resistor 1104A are electrically coupled in series from a high side supply node 208 (e.g., HS_Vdd) to a low voltage return node 1106 (e.g., LV_Vss), such that the first HVMOS device 106A is separated from the high side supply node 208 by the first resistor 1104A. Similarly, the second HVMOS device 106B and the second resistor 1104B are electrically coupled in series from the high side supply node 208 to the low voltage return node 1106, such that the second HVMOS device 106B is separated from the high side supply node 208 by the second resistor 1104B. In some embodiments, the low voltage return node 1106 is electrically coupled to ground 1108.

An edge pulse generator 1110 is powered by a low voltage power supply 1112, and controls gates of the first and second HVMOS devices 106A, 106B based on a high-side input signal 1114. The high-side input signal 1114 is a binary signal varying between 0 volts and a voltage of the low voltage power supply 1112. The low voltage power supply 1112 has an anode electrically coupled to a low voltage supply node 206 (e.g., $LV\_V_{dd}$), and a cathode electrically coupled to the low voltage return node 1106. The low voltage power supply 1112 may be, for example, a direct current (DC) power supply, and/or may, for example, supply a low voltage between about 1-20 volts, between about 1-10 volts, between about 10-20 volts, or less than about 20 volts. The edge pulse generator 1110 detects rising edges of the high-side input signal 1114, and further detects falling edges of the high-side input signal 1114. Further, the edge pulse generator 1110 generates a rising-edge signal 1116A and a falling-edge signal 1116B. The rising-edge signal 1116A has a pulse at each of the detected rising edges and gates the first HVMOS device 106A. The falling-edge signal 1116B has a pulse at each of the detected falling edges and gates the second HVMOS device 106B.

A set-reset (S-R) latch 1118 is set by a set signal 1120A at a shared node of the first HVMOS device 106A and the first resistor 1104A. Further, the S-R latch 1118 is reset by a reset signal 1120B at a shared node of the second HVMOS device 106B and the second resistor 1104B. In some embodiments, the set and reset signals 1120A, 1120B pass through a noise filter (not shown) before passing to the S-R latch 1118. An inverted output (e.g., Q) of the S-R latch 1118 controls a high-side gate driver 1122 to selectively switch the high-side gate driver 1122 between an ON state and an OFF state. For example, the high-side gate driver 1122 may be in an ON state when the inverted output of the S-R latch 1118 indicates a binary "0" and may be in an OFF state when the inverted output of the S-R latch 1118 indicates a binary "1". In some embodiments, the high-side gate driver 1122 is or comprises a complementary metal-oxide-semiconductor (CMOS) inverter. In some embodiments, the high-side gate driver 1122 comprises a p-channel MOS field-effect transistor (MOSFET) 1124P and an n-channel MOSFET 1124N connected in series from the high side supply node 208 to a high side return node 1126 (e.g., $HS\_V_{ss}$), such that the p-channel MOSFET 1124P separates the n-channel MOSFET 1124N from the high side supply node 208.

The bootstrap MOS device 102, the HVJT device 104, and the first and second HVMOS devices 106A, 106B collectively define a ring-shaped structure extending laterally along a boundary of a high side area 108 of an IC die 1128 to surround the high side area 108. In some embodiments, the ring-shaped structure is square ring shaped, rectangular ring shaped, triangular ring shaped, circular ring shaped, or some other closed path shape. Further, the ring-shaped structure is surrounded by a low voltage area 110 of the IC die 1128. The high side area 108 accommodates the S-R latch 1118, the high-side gate driver 1122, the first resistor 1104A, and the second resistor 1104B, whereas the low voltage area 110 accommodates the edge pulse generator 1110.

The bootstrap MOS device 102 and the HVJT device 104 overlap, and the HVJT device 104 is ring-shaped. Further, the bootstrap MOS device 102 is largely ring-shaped, but for discontinuities at the first and second HVMOS devices 106A, 106B. Due to the complexity of the bootstrap MOS device 102 and the HVJT device 104, the bootstrap MOS device 102 and the HVJT device 104 are collectively represented by a ring-shaped box having a transistor 1130 and a diode 1132 respectively representing the functionality of the bootstrap MOS device 102 and the HVJT device 104. The transistor 1130 may, for example, be an n-channel MOSFET gated by a controller 202, and may, for example, have a source and a drain respectively electrically coupled to the low voltage supply node 206 and the high side supply node 208. The diode 1132 may, for example, have a cathode electrically coupled to the high side supply node 208, and an anode electrically coupled to the low voltage return node 1106.

A bootstrap capacitor 204 is electrically coupled from the high side supply node 208 to the high side return node 1126. The bootstrap capacitor 204 is charged by the low voltage power supply 1112, through bootstrap MOS device 102, while the high-side gate driver 1122 is in the OFF state. Further, the bootstrap capacitor 204 powers devices (e.g., the S-R latch 1118) at the high side area 108 to change the high-side gate driver 1122 to the ON state. A high voltage power supply 1136 is electrically coupled to the low voltage return node 1106, and is selectively electrically coupled to the high side return node 1126 by a first power MOSFET 1140. Note that an insulated-gate bipolar transistor (IGBT) or some other switching device may alternatively be used in place of the first power MOSFET 1140. The high voltage power supply 1136 may be, for example, a DC power supply, and/or may, for example, supply a high voltage between about 300-1200 volts, between about 300-750 volts, between about 750-1200 volts, between about 550-650 volts, or in excess of about 300 volts. The first power MOSFET 1140 is gated by an output of the high-side gate driver 1122 and may be, for example, an n-channel power MOSFET. The output of the high-side gate driver 1122 may, for example, be at a node shared by the p-channel MOSFET 1124P and the n-channel MOSFET 1124N.

The bootstrap MOS device 102 limits the flow of current between the low voltage supply node 206 and the high side supply node 208. While the high side supply node 208 is at a lower voltage level than the low voltage supply node 206, the bootstrap MOS device 102 is switched to a non-blocking state by the controller 202 to allow current to flow from the low voltage supply node 206 to the high side supply node 208. This may occur while the high-side gate driver 1122 is in the OFF state and allows the bootstrap capacitor 204 to be charged. While the high side supply node 208 is at a higher voltage level than the low voltage supply node 206, the bootstrap MOS device 102 is switched to a blocking state by the controller 202 to prevent current from flowing between the low voltage supply node 206 and the high side supply node 208. This prevents devices at the low voltage area 110 and/or the low voltage power supply 1112 from being damaged by high voltages at the high side supply node 208 and may occur while the high-side gate driver 1122 is in the ON state.

During operation of the gate driver circuit, the first power MOSFET 1140 may be disabled by changing the high-side input signal 1114 from a binary "1" to a binary "0", thereby resetting the S-R latch 1118. The S-R latch 1118 then outputs a binary "1" at the inverted output, which turns the high-side gate driver 1122 to the OFF state. For example, the p-channel MOSFET 1124P may be disabled, and the n-channel MOSFET 1124N may be enabled, thereby electrically coupling the gate of the first power MOSFET 1140 and the source of the first power MOSFET 1140. Such electrical coupling, in turn, disables the first power MOSFET 1140. Additionally, the high side return node 1126 is electrically coupled to the low voltage return node 1106, and the bootstrap MOS device 102 is switched to the non-blocking state. In some embodiments, this electrical coupling is performed by a second power MOSFET 1142. Note that an IGBT or some other switching device may alternatively be used in place of the second power MOSFET 1142. The second power MOSFET 1142 is gated by a low-side input signal 1144, which may, for example, be generated by a low-side gate driver circuit. Since the bootstrap capacitor 204 has largely been discharged, the high side return node 1126 is electrically coupled to the low voltage return node 1106, and the bootstrap MOS device 102 is in the non-blocking state, the bootstrap capacitor 204 charge from the low voltage power supply 1112.

To enable the first power MOSFET 1140, the bootstrap MOS device 102 is switched to the blocking state, and the high side return node 1126 is electrically separated from the low voltage return node 1106, such that the high side return node 1126 is floating. In some embodiments, this electrical separation is performed by the second power MOSFET 1142. The high-side input signal 1114 is then changed from a binary "0" to a binary "1". This change sets the S-R latch 1118, such that the inverted output of the S-R latch 1118 is at a binary "0". The inverted output changes the high-side gate driver 1122 to the ON state. For example, the inverted output may enable the p-channel MOSFET 1124P, and may disable the n-channel MOSFET 1124N, which electrically couples the bootstrap capacitor 204 from the gate of the first power MOSFET 1140 to the source of the first power MOSFET 1140. Charge accumulated in the bootstrap capacitor 204 then enables the first power MOSFET 1140, which electrically couples the high voltage power supply 1136 to the high side return node 1126. This changes a voltage at the high side supply node 208 to the voltage of the high voltage power supply 1136 plus the voltage across the bootstrap capacitor 204.

With reference to FIGS. 12-18, a series of cross-sectional views 1200-1800 of some embodiments of a method for forming an IC in which a bootstrap MOS device is integrated with an HVJT device and an HVMOS device is provided. The method is illustrated with respect to the IC of FIGS. 4A, 4B, 5A, and 5B, but is also applicable to the IC of any one of FIGS. 1A, 1B, 6A, 6B, 7A, 7B, 8A, 8B, 9A-9D, 10A, and 10B. The cross-sectional views 1200-1600 may, for example, be taken along line A-A' in FIGS. 5A and 5B.

Figure 12:
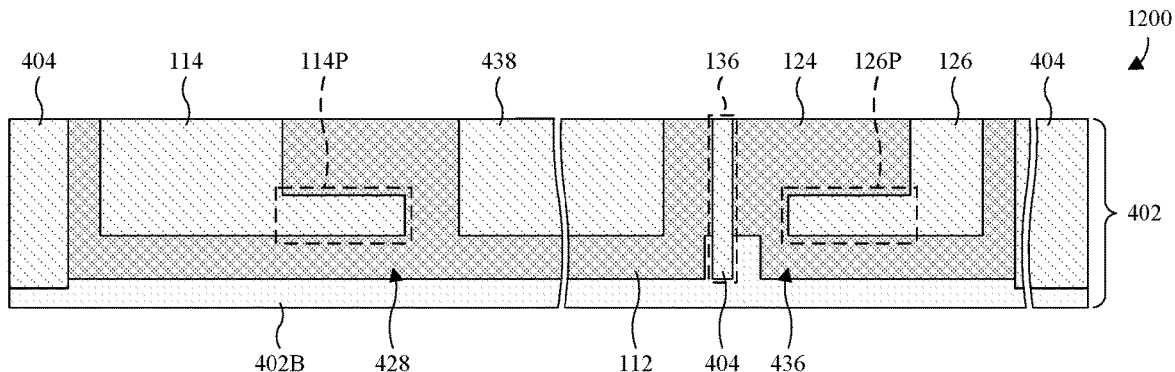
FIGS. 12-18 illustrate a series of cross-sectional views of some embodiments of a method for forming an IC in which a bootstrap MOS device is integrated with an HVJT device and an HVMOS device.

As illustrated by the cross-sectional view 1200 of FIG. 12, a series of doping processes is performed to form a high side well 438, a peripheral well 404, a shared drift well 112, a bootstrap body well 114, an HVMOS drift well 124, and an HVMOS body well 126 in a semiconductor substrate 402. The semiconductor substrate 402 may be, for example, a bulk silicon substrate, a group III-V substrate, a SOI substrate, or some other semiconductor substrate.

The peripheral well 404 overlies a bulk semiconductor region 402B of the semiconductor substrate 402. The peripheral well 404 comprises a pair of segments between which the high side well 438, the shared drift well 112, the bootstrap body well 114, the HVMOS drift well 124, and the HVMOS body well 126 are sandwiched. Further, the peripheral well 402 comprises an isolation ring 136. The isolation ring 136 provides electrical and physical separation between the shared drift well 112 and the HVMOS drift well 124. When viewed top down, the isolation ring 136 may be square ring shaped, rectangular ring shaped, triangular ring shaped, circular ring shaped, or some other closed path shape. In some embodiments, the peripheral well 404 and the bulk semiconductor region 402B have the same doping type, such as, for example, p-type. In some embodiments, the peripheral well 402 is continuous. For example, the various segments of the peripheral well 402 may be connected outside the cross-sectional view 1200 of FIG. 12. See, for example, FIG. 5B.

The shared drift well 112 underlies and laterally surrounds the high side well 438 and the bootstrap body well 114 to completely space the high side well 438 and the bootstrap body well 114 from each other, from the peripheral well 404, and from the bulk semiconductor region 402B. The shared drift well 112 and the peripheral well 404 have opposite doping types and at least partially define the HVJT device under manufacture. Namely, the HVJT device under manufacture is or comprises a diode, and the shared drift well 112 and the peripheral well 404 define a PN junction of the diode. In some embodiments, the shared drift well 112 also has an opposite doping type as the high side well 438 and the bootstrap body well 114, and/or has the same doping type as the HVMOS drift well 124. The shared drift well 112 and the bootstrap body well 114 also support a bootstrap MOS device under manufacture.

The bootstrap body well 114 comprises a protrusion 114P protruding laterally into the shared drift well 112, towards the high side well 438. The protrusion 114P leads to an alternating stack of n-type regions and p-type regions that define a shared RESURF structure 428. The shared RESURF structure 428 is shared by the HVJT device and the bootstrap MOS device. The shared RESURF structure 428 enables the HVJT device and the bootstrap MOS device to sustain operation at high voltages by laterally and vertically distributing high electric fields associated with the high voltages so the maximum electric field is low.

The HVMOS drift well 124 underlies and laterally surrounds the HVMOS body well 126 to completely separate the HVMOS body well 126 from the peripheral well 404 and the bulk semiconductor region 402B. The HVMOS drift well 124 has an opposite doping type as the peripheral well 404 and the HVMOS body well 126. The HVMOS drift well 124 and the HVMOS body well 126 support the HVMOS device under manufacture. The HVMOS body well 126 comprises a protrusion 126P protruding laterally into the HVMOS drift well 124, towards the high side well 438. The protrusion 126P leads to an alternating stack of n-type regions and p-type regions that define an HVMOS RESURF structure 436. Similar to the shared RESURF structure 428, the HVMOS RESURF structure 436 enables the HVMOS device 106A to sustain operation at high voltages by laterally and vertically distributing high electric fields associated with the high voltages so the maximum electric field is low.

The doping processes of FIG. 12 may, for example, be performed by ion implantation and/or some other doping processes. In some embodiments, the doping processes comprise n-type doping processes and p-type doping processes. The n-type doping processes are performed to form n-type wells, and the p-type doping processes are performed to form p-type wells. The p-type wells may, for example, include the peripheral well 404, the high side well 438, the bootstrap body well 114, and the HVMOS body well 126, and the n-type wells may, for example, include the shared drift well 112 and the HVMOS drift well 124, or vice versa. In some embodiments, some or all of the n-type and p-type doping processes is/are each performed by forming a mask with a pattern over the semiconductor substrate 402, performing ion implantation into the semiconductor substrate 402 with the mask in place, and removing the mask. The mask may, for example, have a pattern of the one or more wells being formed by the ion implantation, and may, for example, be photoresist, silicon nitride, or some other material.

Figure 13:
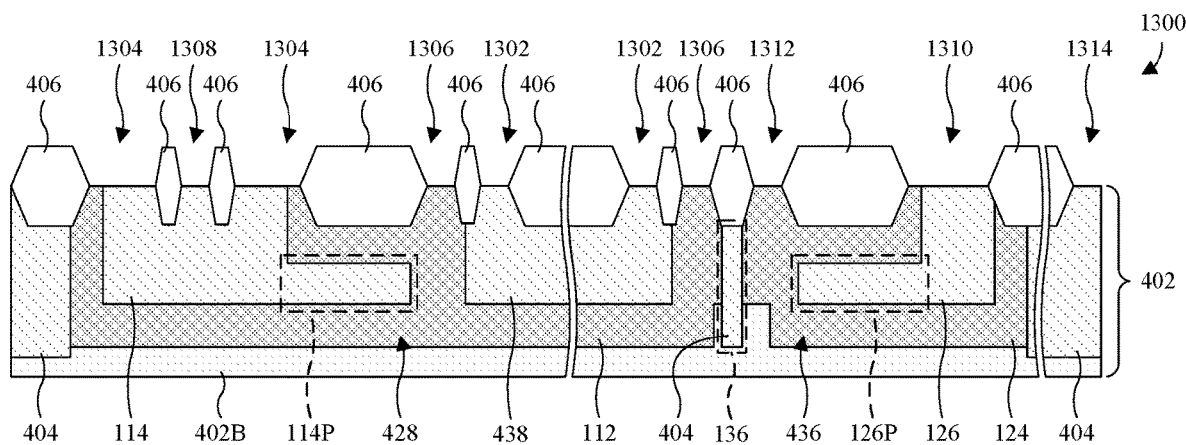

As illustrated by the cross-sectional view 1300 of FIG. 13, an isolation structure 406 is formed over the semiconductor substrate 402, demarcating boundaries for doped regions (e.g., contact regions and/or source/drain regions) to be formed hereafter. The isolation structure 406 comprises a dielectric material (e.g., silicon oxide), and may be or comprise, for example, a STI structure, a FOX structure, a LOCOS structure, or some other isolation structure.

Overlying the high side well 438, the isolation structure 406 defines a high side opening 1302. The high side opening 1302 is on opposite sides of the high side well 438 and may, for example, have a ring-shaped top layout. Overlying the bootstrap body well 114 and the shared drift well 112, the isolation structure 406 defines a pair of low-side bootstrap openings 1304. Overlying the shared drift well 112 and adjacent to the high side well 438, the isolation structure 406 defines a high-side bootstrap opening 1306. The high-side bootstrap opening 1306 is on opposite sides of the high side well 438 and may, for example, have a ring-shaped top layout. As used herein with respect to the high side opening 1302 and the high-side bootstrap opening 1306, ring-shaped may be circular ring shaped, square ring shaped, rectangular ring shaped, triangular ring shaped, or some other closed path shape. Overlying the bootstrap body well 114 and sandwiched between the low-side bootstrap openings 1304, the isolation structure 406 defines a bootstrap body opening 1308. Overlying a boundary between the HVMOS drift well 124 and the HVMOS body well 126, the isolation structure 406 defines a low-side HVMOS opening 1310. Overlying the HVMOS drift well 124 and adjacent to the isolation ring 136, the isolation structure 406 defines a high-side HVMOS opening 1312. Overlying the peripheral well 404 and adjacent to the HVMOS drift well 124, the isolation structure 406 defines a peripheral opening 1314.

In some embodiments, a process for forming the isolation structure 406 comprises forming a mask (not shown) covering the semiconductor substrate 402 and having a layout of the isolation structure 406. The mask may, for example, be silicon nitride, photoresist, or some other suitable mask material. An oxidation process is then performed with mask in place to form the isolation structure 406, and the mask is subsequently removed.

Figure 14:
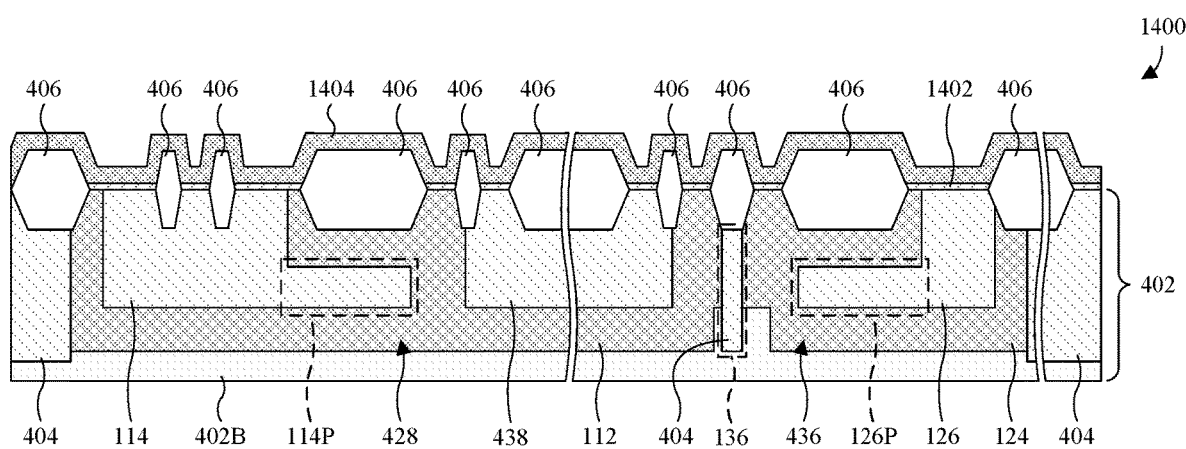

As illustrated by the cross-sectional view 1400 of FIG. 14, a dielectric layer 1402 and a conductive layer 1404 are formed stacked over the semiconductor substrate 402 and the isolation structure 406. The dielectric layer 1402 may be or comprise, for example, silicon oxide, hafnium oxide, or some other dielectric, and/or the conductive layer 1404 may be or comprise, for example, doped polysilicon, metal, or some other conductive material. In some embodiments, the dielectric layer 1402 is formed by thermal oxidation, chemical vapor deposition (CVD), physical vapor deposition (PVD), some other deposition or oxidation process, or any combination of the foregoing. In some embodiments, the conductive layer 1404 is formed by CVD, PVD, electroless plating, electroplating, some other deposition or plating process, or any combination of the foregoing.

Figure 15:
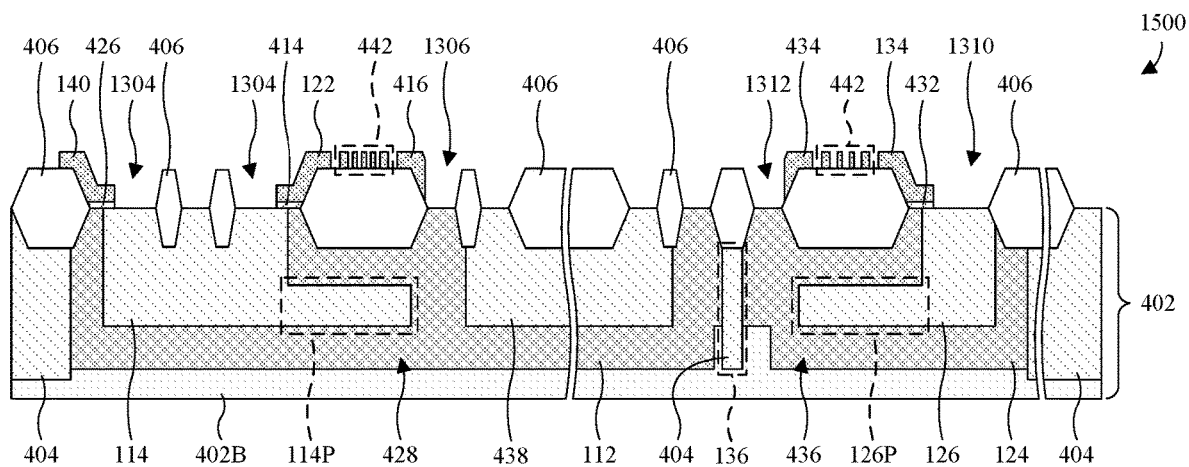

As illustrated by the cross-sectional view 1500 of FIG. 15, the dielectric layer 1402 (see FIG. 14) and the conductive layer 1404 (see FIG. 14) are patterned. Overlying the HVMOS drift well 124, the patterning forms a HVMOS gate electrode 134 and a HVMOS gate dielectric layer 432 stacked in the low-side HVMOS opening 1310 and lining a sidewall of the isolation structure 406. Further, the patterning forms an HVMOS field plate 434 in the high-side HVMOS opening 1312 and lining a sidewall of the isolation structure 406. Overlying the shared drift well 112, the patterning forms a first bootstrap gate electrode 122 and a first bootstrap gate dielectric layer 414 stacked in one of the low-side bootstrap openings 1304 and lining a sidewall of the isolation structure 406. Further, the patterning forms a second bootstrap gate electrode 140 and a second bootstrap gate dielectric layer 426 stacked in another one of the low-side bootstrap openings 1304 and lining a sidewall of the isolation structure 406. Further yet, the patterning forms a bootstrap field plate 416 in the high-side bootstrap opening 1306 and lining a sidewall of the isolation structure 406.

In some embodiments, a process for performing the patterning comprises forming a mask overlying the conductive layer 1404, and subsequently performing an etch into the conductive layer 1404 and the dielectric layer 1402 with the mask in place. The mask is thereafter removed and may, for example, be or comprise photoresist, silicon nitride, or some other mask material.

In some embodiments, the patterning of the conductive layer 1404 also forms a spiral structure 442 overlying both the shared drift well 112 and the HVMOS drift well 124. In other embodiments, the spiral structure 442 is formed independent of the conductive layer 1404 and/or the patterning of the conductive layer 1404. For example, a second conductive layer (not shown) may be formed and subsequently patterned into the spiral structure 442. The second conductive layer may, for example, be a different material than the conductive layer 1404 and/or may, for example, be metal, doped polysilicon, or some other conductive material. Further, the second conductive layer may, for example, be formed by CVD, PVD, electroless plating, electroplating, some other deposition or plating process, or any combination of the foregoing. The patterning of the second conductive layer may, for example, be performed by photolithography and/or as the patterning of the conductive layer 1404 is described above.

Figure 16:
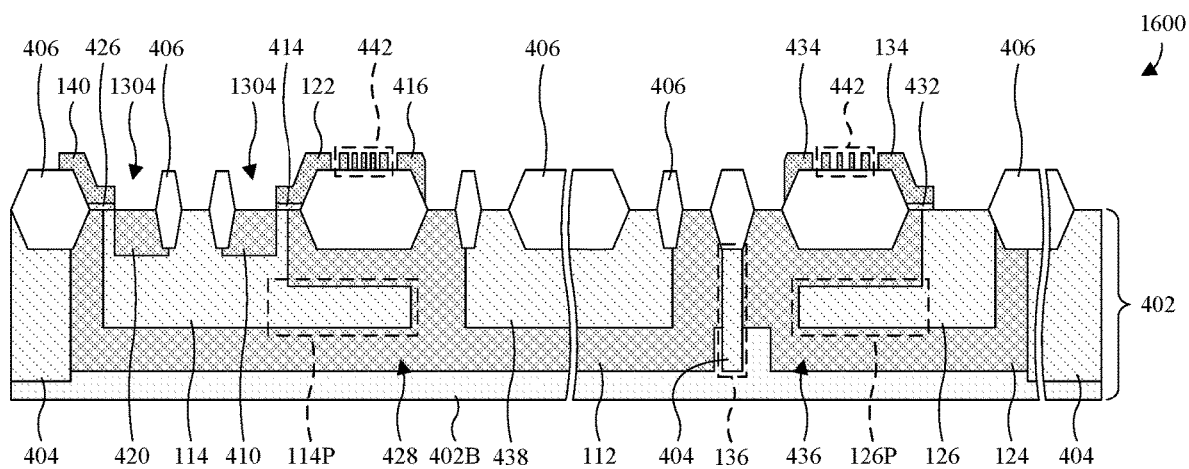

As illustrated by the cross-sectional view 1600 of FIG. 16, a doping process is performed to form a first bootstrap drift well 410 and a second bootstrap drift well 420 in the semiconductor substrate 402. The first bootstrap drift well 410 overlies the bootstrap body well 114 and is formed through one of the low-side bootstrap openings 1304 adjacent to the first bootstrap gate electrode 122. The second bootstrap drift well 420 overlies the bootstrap body well 114 and is formed through another one of the low-side bootstrap openings 1304 adjacent to the second bootstrap gate electrode 140. The first and second bootstrap drift wells 410, 420 have an opposite doping type as the bootstrap body well 114.

The doping processes may, for example, be performed by ion implantation and/or some other doping processes. In some embodiments, the doping process is performed by forming a mask with a pattern over the semiconductor substrate 402, performing ion implantation into the semiconductor substrate 402 with the mask in place, and removing the mask. The mask may, for example, have a pattern of the first and second bootstrap drift wells 410, 420, and may, for example, be photoresist, silicon nitride, or some other material.

Figure 17:
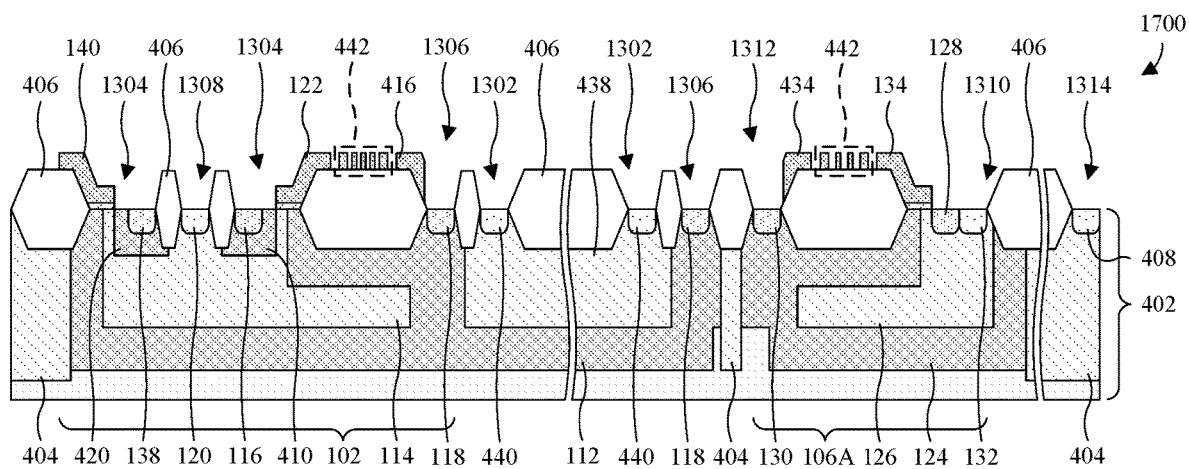

As illustrated by the cross-sectional view 1700 of FIG. 17, a series of doping processes is performed to form contact regions and source/drain regions in the semiconductor substrate 402. A peripheral contact region 408 is formed overlying the peripheral well 404 and adjacent to the HVMOS drift well 124 through the peripheral opening 1314. The peripheral contact region 408 has the same doping type as, but a higher doping concentration than, the peripheral well 404. A high side contact region 440 is formed overlying the high side well 438 through the high side opening 1302. The high side contact region 440 is on opposite sides of the high side well 438 and has the same doping type as, but a higher doping concentration than, the high side well 438. In some embodiments, the high side contact region 440 has a top layout that is square ring-shaped, circular ring-shaped, or some other closed path shape.

A first HVMOS source/drain region 128 and a HVMOS body contact region 132 are formed overlying the HVMOS body well 126 through the low-side HVMOS opening 1310. A second HVMOS source/drain region 130 is formed overlying the HVMOS drift well 124 through the high-side HVMOS opening 1312. The first and second HVMOS source/drain regions 128, 130 have the same doping type as, but a higher doping concentration than, the HVMOS drift well 124. The HVMOS body contact region 132 has the same doping type as, but a higher doping concentration than, the HVMOS body well 126. The first and second HVMOS source/drain regions 128, 130, the HVMOS body contact region 132, the HVMOS gate electrode 134, and the HVMOS field plate 434 at least partially define an HVMOS device 106A on the HVMOS body well 126 and the HVMOS drift well 124.

A first bootstrap source/drain region 116 is formed overlying the first bootstrap drift well 410 through one of the low-side bootstrap openings 1304. A second bootstrap source/drain region 118 is formed overlying the shared drift well 112 through the high-side bootstrap opening 1306. A third bootstrap source/drain region 138 is formed overlying the second bootstrap drift well 420 through another one of the low-side bootstrap openings 1304. A bootstrap body contact region 120 is formed overlying the bootstrap body well 114 through the bootstrap body opening 1308. The first, second, and third bootstrap source/drain regions 116, 118, 138 have the same doping type as, but a higher doping concentration than, the shared drift well 112 and the first and second bootstrap drift wells 410, 420. The bootstrap body contact region 120 has the same doping type as, but a higher doping concentration than, the bootstrap body well 114. The first, second, and third bootstrap source/drain regions 116, 118, 138, the bootstrap body contact region 120, the first and second bootstrap gate electrodes 122, 140, and the bootstrap field plate 416 at least partially define a bootstrap MOS device 102 on the bootstrap body well 114 and the shared drift well 112.

The doping processes of FIG. 17 may, for example, be performed by ion implantation and/or some other doping processes. In some embodiments, the doping processes comprise an n-type doping process and a p-type doping process. In some embodiments, each of the doping processes is performed by forming a mask with a pattern over the semiconductor substrate 402, performing ion implantation into the semiconductor substrate 402 with the mask in place, and removing the mask. The mask may, for example, have a pattern of the one or more contact and/or source/drain regions being formed by the ion implantation, and may, for example, be photoresist, silicon nitride, or some other material.

Figure 18:
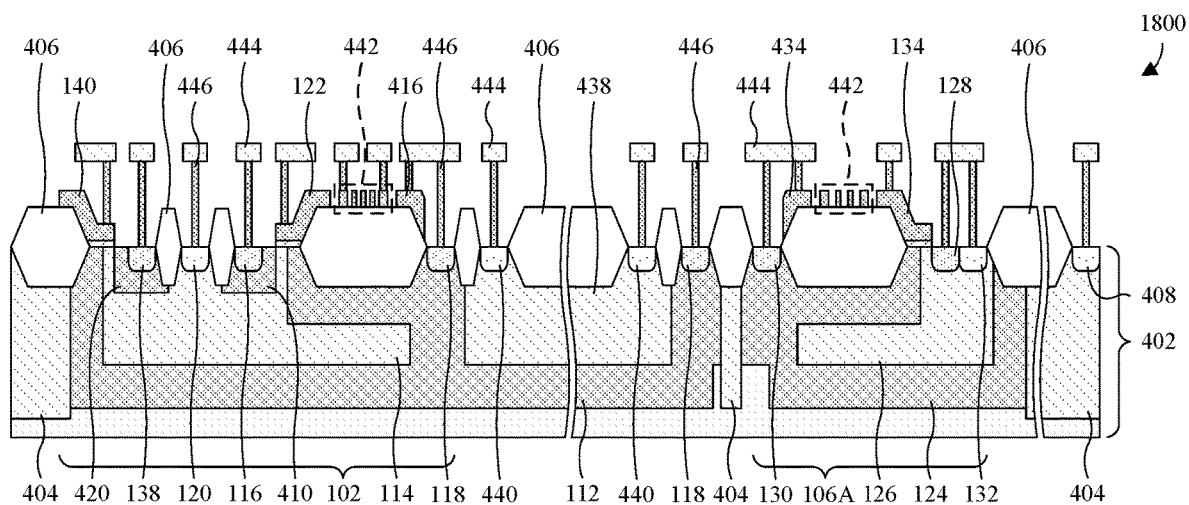

As illustrated by the cross-sectional view 1800 of FIG. 18, a back-end-of-line (BEOL) metallization process is performed to form a plurality of conductive wires 444 and a plurality of conductive vias 446 stacked over the semiconductor substrate 402. For ease of illustration, only some of the conductive wires 444 are labeled 444, and only some of the conductive vias 446 are labeled 446. The conductive wires 444 and the conductive vias 446 define conductive paths interconnecting the various source/drain regions (e.g., the first bootstrap source/drain region 116), the various contact regions (e.g., the high side contact region 440), the various field plates (e.g., the bootstrap field plate 416), the various gate electrodes (e.g., the HVMOS gate electrode 134), and the spiral structure 442. The conductive wires 444 and the conductive vias 446 may be or comprise, for example, copper, aluminum copper, aluminum, tungsten, some other conductive material, or any combination of the foregoing.

In some embodiments, the conductive vias 446 are formed by forming an interlayer dielectric (ILD) layer (not shown) covering the structure of FIG. 17, performing a planarization into a top surface of the ILD layer, and patterning the ILD layer to define via openings corresponding to the conductive vias 446. A conductive layer (not shown) is formed covering the ILD layer and filling the via openings. A planarization is performed into a top surface of the conductive layer until the top surface of the conductive layer is about even with the top surface of the ILD layer, thereby forming the conductive vias 446 from the conductive layer. The above described process for forming the conductive vias 446 is then repeated for the conductive wires 444.

Figure 19:
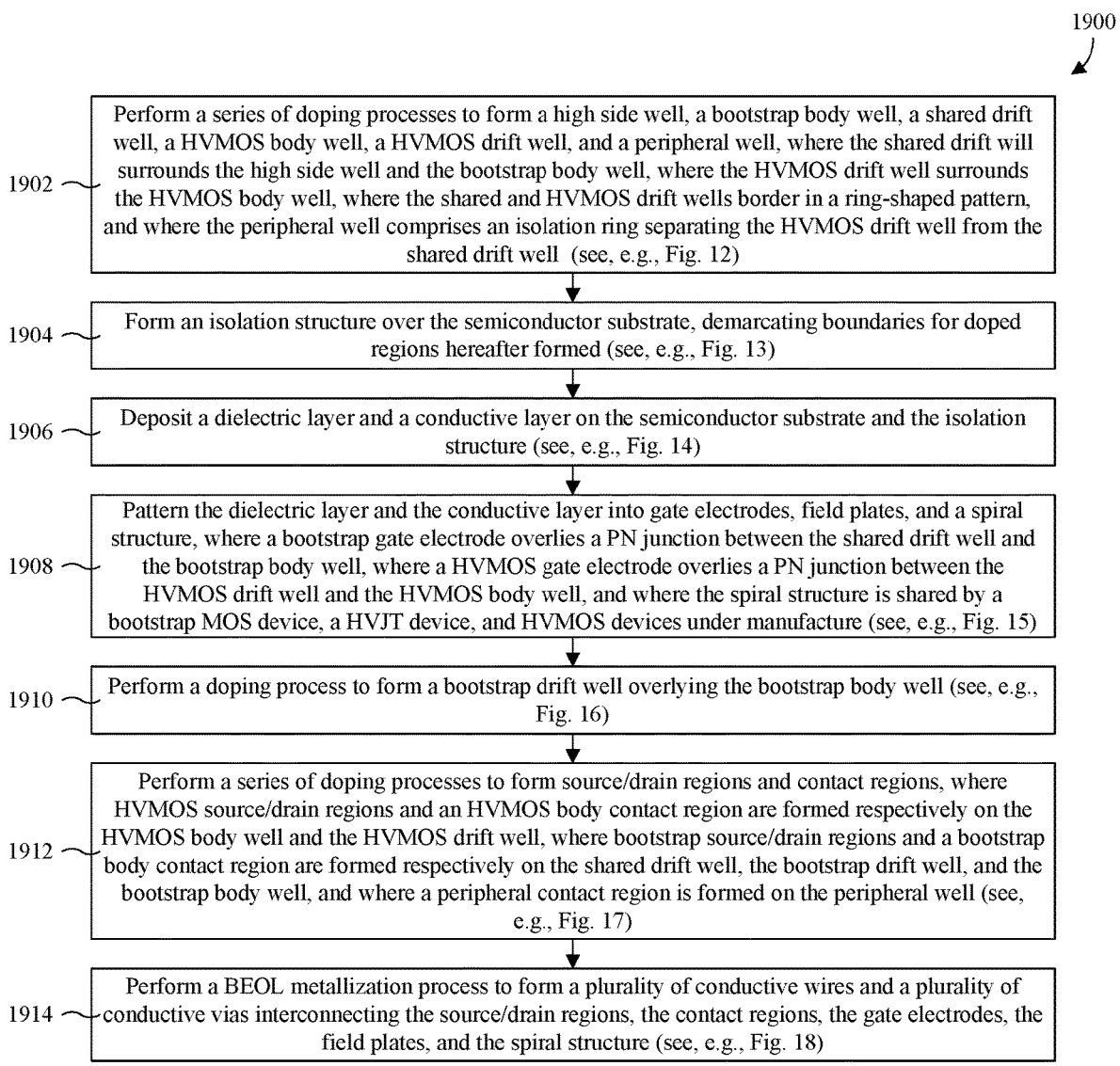
FIG. 19 illustrates a flowchart of some embodiments of the method of FIGS. 12-18.

With reference to FIG. 19, a flowchart 1900 of some embodiments of the method of FIGS. 12-18 is provided.

As 1902, a series of doping processes is performed to form a high side well, a bootstrap body well, a shared drift well, a HVMOS body well, a HVMOS drift well, and a peripheral well. The shared drift will surrounds the high side well and the bootstrap body well. The HVMOS drift well surrounds the HVMOS body well. The shared and HVMOS drift wells border in a ring-shaped pattern. The peripheral well comprises an isolation ring separating the HVMOS drift well from the shared drift well. See, for example, FIG. 12.

At 1904, an isolation structure is formed over the semiconductor substrate, demarcating boundaries for doped regions hereafter formed. See, for example, FIG. 13.

At 1906, a dielectric layer and a conductive layer are formed on the semiconductor substrate and the isolation structure. See, for example, FIG. 14.

At 1908, the dielectric layer and the conductive layer are patterned into gate electrodes, field plates, and a spiral structure. A bootstrap gate electrode overlies a PN junction between the shared drift well and the bootstrap body well. A HVMOS gate electrode overlies a PN junction between the HVMOS drift well and the HVMOS body well. The spiral structure is shared by a bootstrap MOS device under manufacture, a HVJT device under manufacture, and an HVMOS device under manufacture. See, for example, FIG. 15.

At 1910, a doping process is performed to form a bootstrap drift well overlying the bootstrap body well. See, for example, FIG. 16.

At 1912, a series of doping processes is performed to form source/drain regions and contact regions. HVMOS source/drain regions and an HVMOS body contact region are formed respectively on the HVMOS body well and the HVMOS drift well. Bootstrap source/drain regions and a bootstrap body contact region are formed respectively on the shared drift well, the bootstrap drift well, and the bootstrap body well. A peripheral contact region is formed on the peripheral well. See, for example, FIG. 17.

At 1914, a BEOL metallization process is performed to form a plurality of conductive wires and a plurality of conductive vias interconnecting the source/drain regions, the contact regions, the gate electrodes, the field plates, and the spiral structure. See, for example, FIG. 18.

While the flowchart 1900 of FIG. 19 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present application provides an integrated circuit including: a semiconductor substrate; a drift well in the semiconductor substrate, wherein the drift well has a first doping type and has a ring-shaped top layout; a first switching device on the drift well; a second switching device on the semiconductor substrate, at an indent in a sidewall of the drift well; and a peripheral well in the semiconductor substrate and having a second doping type opposite the first doping type, wherein the peripheral well surrounds the drift well, the first switching device, and the second switching device, and wherein the peripheral well separates the second switching device from the drift well. In some embodiments, the first switching device includes a plurality of gate electrodes, and wherein each of the gate electrodes overlies a PN junction defined in part by the drift well. In some embodiments, the first switching device includes: a body well overlying the drift well, wherein the body well has the second doping type and is spaced from the peripheral well by the drift well; a first source/drain region overlying the body well; a second source/drain region overlying the drift well and spaced from the body well; and a gate electrode bordering the first source/drain region and overlying a PN junction at which the drift well contacts the body well. In some embodiments, the integrated circuit further includes: a third source/drain region overlying the body well; and a second gate electrode bordering the third source/drain region and overlying a second PN junction at which the drift well contacts the body well, wherein the PN junction and the second PN junction are on opposite sides of the body well. In some embodiments, the integrated circuit further includes: a second body well overlying the drift well, wherein the second body well is separated from the body well and the peripheral well by the drift well, and wherein the body well is between the second body well and the second source/drain region; a fourth source/drain region overlying the second body well; and a third gate electrode bordering the fourth source/drain region and overlying a PN junction at which the drift well contacts the second body well. In some embodiments, the body well protrudes laterally into the drift well towards the second switching device, such that the semiconductor substrate has an alternating stack of p-type and n-type regions defining a RESURF structure. In some embodiments, the integrated circuit further includes a third switching device on the semiconductor substrate, at a second indent in the sidewall of the drift well or another sidewall of the drift well. In some embodiments, the first and second switching devices are LDMOS transistors. In some embodiments, the peripheral well and the drift well directly contact at a ring-shaped PN junction. In some embodiments, the integrated circuit further includes a spiral structure overlying the drift well, the first switching device, and the second switching device, wherein the spiral structure is conductive and has a continuous, spiral-shaped top layout.

In some embodiments, the present application provides another integrated circuit including: a substrate; a first drift well and a second drift well in the substrate, wherein the first and second drift wells have a first doping type, wherein the first drift well is ring-shaped, and wherein the second drift well is recessed into a side of the first drift well; a peripheral well in the substrate and having a second doping type, wherein the peripheral well surrounds and separates the first and second drift wells, and wherein the second doping type is opposite the first doping type; a first body well and a second body in the substrate, wherein the first and second body wells have the second doping type and respectively overly the first and second drift wells, wherein the first and second body wells are spaced from the peripheral well respectively by the first and second drift wells; a first gate electrode overlying a boundary between the first drift and body wells; and a second gate electrode overlying a boundary between the second drift and body wells. In some embodiments, the integrated circuit further includes a high side well in the substrate and having the second doping type, wherein the high side well overlies the first drift well and is spaced from the peripheral well by the first drift well, and wherein the first drift well extends laterally in a ring-shaped path, along a boundary of the high side well, to enclose the high side well. In some embodiments, the integrated circuit further includes: a first contact region overlying the first drift well and bordering the high side well, wherein the first contact region has a higher doping concentration than the first drift well; and a second contact region overlying the high side well, wherein the second contact region has a higher doping concentration than the high side well, and wherein the first and second contact regions are ring-shaped and respectively have opposite doping types. In some embodiments, the integrated circuit further includes: a pair of first source/drain regions overlying the first body well; a second source/drain region overlying the first drift well and laterally spaced from the first body well; and a third gate electrode overlying another boundary between the first drift and body wells, wherein the third gate electrode borders one of the first source/drain regions, and wherein the first gate electrode borders another one of the first source/drain regions. In some embodiments, the integrated circuit further includes: a third body well overlying the first drift well and having the second doping type, wherein the third body well is spaced from the peripheral well and the first drift well by the first drift well, wherein the third gate electrode overlies both the first and third body well; a third source/drain region overlying the third body well; and a fourth gate electrode bordering the third source/drain region and overlying a PN junction at which the first drift well contacts the second body well. In some embodiments, the integrated circuit further includes: a spiral structure overlying both the first and second drift wells, wherein the spiral structure is conductive and has a continuous, spiral-shaped top layout. In some embodiments, the first body well protrudes laterally into the first drift well towards the second drift well, such that the substrate has a first alternating stack of p-type and n-type regions defining a first RESURF structure, and wherein the second body well protrudes laterally into the second drift well towards the first drift well, such that the substrate has a second alternating stack of p-type and n-type regions defining a second RESURF structure. In some embodiments, the peripheral well and the first drift well directly contact at a first ring-shaped PN junction, wherein the peripheral well and the second drift well directly contact at a second ring-shaped PN junction, and wherein the first ring-shaped PN junction conforms around the second ring-shaped PN junction.

In some embodiments, the present application provides a method for manufacturing an integrated circuit, the method including: performing a series of doping processes into a substrate to form: a first drift well and a second drift well having a first doping type, wherein the first drift well has a ring-shaped top layout, and wherein the second drift well is at an indent in the ring-shaped top layout; a peripheral well having a second doping type opposite the first doping type, wherein the peripheral well surrounds and separates the first and second drift wells; and a first body well and a second body well having the second doping type and respectively overlying the first and second drift wells, wherein the first and second body wells are spaced from the peripheral well; and depositing a conductive layer over the substrate; and patterning the conductive layer to form a first gate electrode and a second gate electrode respectively on a first PN junction and a second PN junction, wherein the first PN junction is defined by the first drift and body wells, and wherein the second PN junction is defined by the second drift and body wells. In some embodiments, the method further includes forming a ring-shaped isolation structure overlying the first and second drift wells, wherein the conductive layer is deposited over the isolation structure, and wherein the patterning forms a spiral structure overlying the ring-shaped isolation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
   a semiconductor substrate;
   a drift well in the semiconductor substrate, wherein the drift well has a first doping type;
   a first switching device on the drift well and comprising a first body well overlying the drift well in the semiconductor substrate, wherein the first body well has a second doping type opposite the first doping type and a lateral protrusion buried in the drift well, wherein the first switching device comprises a first gate electrode overhanging the lateral protrusion and covering a first sidewall boundary of the first body well that directly contacts the drift well, wherein the first switching device comprises a second gate electrode, and wherein the second gate electrode covers a second sidewall boundary of the first body well that directly contacts the drift well and is on an opposite side of the first body well as the first gate electrode;
   a second switching device on the semiconductor substrate, wherein the lateral protrusion protrudes towards the second switching device; and
   a peripheral well in the semiconductor substrate and having the second doping type, wherein the peripheral well is spaced from the first body well and surrounds the drift well, the first switching device, and the second switching device, and wherein the peripheral well separates the second switching device from the drift well.

2. The integrated circuit according to claim 1, wherein the first switching device comprises:
   a first source/drain region overlying the first body well and bordering the first gate electrode; and
   a second source/drain region directly on the drift well and spaced from the first body well.

3. The integrated circuit according to claim 2, wherein the first switching device further comprises:
   a third source/drain region overlying the first body well, wherein the second gate electrode borders the third source/drain region.

4. The integrated circuit according to claim 1, wherein the first switching device further comprises:
   a second body well overlying the drift well, wherein the second body well is separated from the first body well and the peripheral well by the drift well, and wherein the first body well is between the second body well and the second switching device; and
   a source/drain region overlying the second body well, wherein the second gate electrode borders the source/drain region.

5. The integrated circuit according to claim 1, wherein a bulk region of the semiconductor substrate has the second doping type and underlies the drift well, and wherein the semiconductor substrate has an alternating stack of p-type and n-type regions defining a reduced surface field (RESURF) structure at the lateral protrusion and the bulk region of the semiconductor substrate.

6. The integrated circuit according to claim 1, further comprising:
   a third switching device on the semiconductor substrate, at an indent in a sidewall of the drift well.

7. The integrated circuit according to claim 1, wherein the peripheral well and the drift well directly contact at a ring-shaped PN junction.

8. The integrated circuit according to claim 1, further comprising:
   a spiral structure overlying the drift well, the first switching device, and the second switching device, wherein the spiral structure is conductive and has a continuous, spiral-shaped top layout.

9. The integrated circuit according to claim 1, wherein the first switching device further comprises:
   a second body well overlying the drift well, wherein the second body well has a C-shaped top layout and surrounds the first body well.

10. An integrated circuit comprising:
    a substrate;
    a first drift well and a second drift well in the substrate, wherein the first and second drift wells have a first doping type;
    a peripheral well in the substrate and having a second doping type, wherein the peripheral well surrounds and separates the first and second drift wells, and wherein the second doping type is opposite the first doping type;
    a first body well and a second body well in the substrate, wherein the first and second body wells have the second doping type and respectively overly the first and second drift wells, and wherein the first and second body wells are spaced from the peripheral well respectively by the first and second drift wells;
    a first gate electrode overlying a boundary between the first drift and body wells;
    a second gate electrode overlying a boundary between the second drift and body wells; and a third body well overlying the first drift well and having the second doping type, wherein the third body well is spaced from the peripheral well and the first body well by the first drift well.

11. The integrated circuit according to claim 10, further comprising:
a high side well in the substrate and having the second doping type, wherein the high side well overlies the first drift well and is spaced from the peripheral well by the first drift well, and wherein the first drift well extends laterally in a ring-shaped path, along a boundary of the high side well, to enclose the high side well.

12. The integrated circuit according to claim 11, further comprising:
a first contact region overlying the first drift well and bordering the high side well, wherein the first contact region has a higher doping concentration than the first drift well; and
a second contact region overlying the high side well, wherein the second contact region has a higher doping concentration than the high side well, and wherein the first and second contact regions are ring-shaped and respectively have opposite doping types.

13. The integrated circuit according to claim 10, further comprising:
a pair of first source/drain regions overlying the first body well;
a second source/drain region overlying the first drift well and laterally spaced from the first body well; and
a third gate electrode overlying another boundary between the first drift and body wells, wherein the third gate electrode borders one of the first source/drain regions, and wherein the first gate electrode borders another one of the first source/drain regions.

14. The integrated circuit according to claim 10, further comprising:
a third gate electrode overlying both the first and third body wells;
a source/drain region overlying the third body well; and
a fourth gate electrode bordering the source/drain region and overlying a PN junction at which the first drift well contacts the third body well.

15. The integrated circuit according to claim 10, further comprising:
a spiral structure overlying both the first and second drift wells, wherein the spiral structure is conductive and has a continuous, spiral-shaped top layout.

16. The integrated circuit according to claim 10, wherein the first body well protrudes laterally into the first drift well towards the second drift well, such that the substrate has a first alternating stack of p-type and n-type regions defining a first reduced surface field (RESURF) structure, and wherein the second body well protrudes laterally into the second drift well towards the first drift well, such that the substrate has a second alternating stack of p-type and n-type regions defining a second RESURF structure.

17. The integrated circuit according to claim 10, wherein the peripheral well and the first drift well directly contact at a first ring-shaped PN junction, wherein the peripheral well and the second drift well directly contact at a second ring-shaped PN junction, and wherein the first ring-shaped PN junction conforms around the second ring-shaped PN junction.

18. The integrated circuit according to claim 10, wherein the boundary that the first gate electrode overlies is a sidewall boundary, and wherein the boundary that the second gate electrode overlies is a sidewall boundary.

19. An integrated circuit comprising:
a substrate;
a first drift well and a second drift well in the substrate, wherein the first and second drift wells have a first doping type;
a high side well overlying the first drift well in the substrate, wherein the high side well has a second doping type opposite the first doping type, wherein a sidewall of the high side well directly contacts a first sidewall of the first drift well at a first PN junction continuously in a first closed path that extends laterally around the high side well;
a switching device on the second drift well, wherein the first PN junction has a lateral indent at the switching device;
a peripheral well in the substrate and having the second doping type, wherein a first sidewall of the peripheral well directly contacts a second sidewall of the first drift well at a second PN junction continuously in a second closed path that extends laterally around the high side well, and wherein a second sidewall of the peripheral well directly contacts a sidewall of the second drift well at a third PN junction continuously in a third closed path that extends laterally around the switching device;
a first body well overlying the first drift well in the substrate, wherein the first body well has the second doping type and is completely spaced from the peripheral well, and wherein a sidewall of the first body well directly contacts a third sidewall of the first drift well at a fourth PN junction continuously in a fourth closed path that extends laterally around the first body well; and
a first gate electrode and a second gate electrode that are independent of each other and that cover the fourth PN junction respectively on opposite sides of the first body well, and wherein the first gate electrode is between the second gate electrode and the high side well.

20. The integrated circuit according to claim 19, further comprising:
a third drift well and a fourth drift well overlying the first body well in the substrate, wherein the third and fourth drift wells have the first doping type, wherein the third and fourth drift wells are spaced from each other and are spaced from the first drift well by the first body well, and wherein third and fourth drift wells are between the first and second gate electrodes and respectively border the first and second gate electrodes.

* * * * *